United States Patent
Kubota et al.

(10) Patent No.: US 7,012,338 B2
(45) Date of Patent: *Mar. 14, 2006

(54) SEMICONDUCTOR DEVICE, LIQUID CRYSTAL DISPLAY DEVICE AND METHOD OF MANUFACTURING THE SEMICONDUCTOR DEVICE

(75) Inventors: Takeshi Kubota, Hyogo (JP); Toru Takeguchi, Hyogo (JP); Nobuhiro Nakamura, Kumamoto (JP)

(73) Assignees: Mitsubishi Denki Kabushiki Kaisha, Tokyo (JP); Advanced Display Inc., Kumamoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/940,822

(22) Filed: Sep. 15, 2004

(65) Prior Publication Data

US 2005/0036081 A1     Feb. 17, 2005

Related U.S. Application Data

(62) Division of application No. 10/342,312, filed on Jan. 15, 2003, now Pat. No. 6,794,759, which is a division of application No. 09/592,277, filed on Jun. 12, 2000, now Pat. No. 6,534,349.

(30) Foreign Application Priority Data

Dec. 17, 1999   (JP)   ................... 11-358591

(51) Int. Cl.
    H01L 23/48    (2006.01)
    H01L 23/52    (2006.01)
    H01L 29/40    (2006.01)
    H01L 29/41    (2006.01)
    H01L 29/43    (2006.01)

(52) U.S. Cl. ................. 257/775; 257/765; 257/758

(58) Field of Classification Search ............... 257/775, 257/771, 765, 758, 750, 741, 734; 438/30, 438/158, 652, 688

See application file for complete search history.

(56) References Cited

U.S. PATENT DOCUMENTS

| 5,036,370 A | 7/1991 | Miyago et al. |
| 5,313,101 A | 5/1994 | Harada et al. |
| 5,534,463 A | 7/1996 | Lee et al. |
| 5,734,452 A | 3/1998 | Yamaue et al. |
| 5,825,449 A | 10/1998 | Shin |
| 5,869,902 A | 2/1999 | Lee et al. |
| 5,969,386 A | 10/1999 | Hong |
| 6,016,012 A | 1/2000 | Chatila et al. |

(Continued)

FOREIGN PATENT DOCUMENTS

JP        6-230400        8/1994

(Continued)

*Primary Examiner*—M. Wilczewski
(74) *Attorney, Agent, or Firm*—McDermott Will & Emery LLP

(57) ABSTRACT

A terminal interconnection 45a including an aluminum alloy film 4a and a nitrogen-containing aluminum film 5a layered together is formed on a glass substrate 2. Nitrogen-containing aluminum film 5a in a contact portion 12a within a contact hole 11a exposing the surface of terminal interconnection 45a has a predetermined thickness $d_1$ determined based on a specific resistance of the nitrogen-containing aluminum film. The thickness of the nitrogen-containing aluminum film outside the contact portion is larger than that of the nitrogen-containing aluminum film within the contact portion. Thereby, a semiconductor device or a liquid crystal display device having a reduced contact resistance and an appropriate resistance against chemical liquid is achieved.

2 Claims, 23 Drawing Sheets

U.S. PATENT DOCUMENTS

| | | |
|---|---|---|
| 6,110,766 A | 8/2000 | Hong |
| 6,218,283 B1 | 4/2001 | Park et al. |
| 6,252,247 B1 | 6/2001 | Sakata et al. |
| 6,261,950 B1 | 7/2001 | Tobben et al. |
| 6,650,017 B1 | 11/2003 | Akamatsu et al. |

FOREIGN PATENT DOCUMENTS

| | | |
|---|---|---|
| JP | 7-113726 | 12/1995 |
| JP | 09148586 A | 6/1997 |
| JP | 11-24088 | 1/1999 |

SEMICONDUCTOR DEVICE, LIQUID CRYSTAL DISPLAY DEVICE AND METHOD OF MANUFACTURING THE SEMICONDUCTOR DEVICE

This application is a divisional of application Ser. No. 10/342,312 filed Jan. 15, 2003, Now U.S. Pat. No. 6,794,759, which is a divisional of application Ser. No. 09/592,277 filed Jun. 12, 2000 now U.S. Pat. No. 6,534,349.

BACKGROUND OF THE INVENTION

1. Field of the Invention

The present invention relates to a semiconductor device, a liquid crystal display device and a method of manufacturing a semiconductor device, and particularly relates to a semiconductor device and a liquid crystal display device, in which a contact portion in contact with an interconnection, an electrode or the like has a reduced contact resistance, as well as a method of manufacturing such a semiconductor device.

2. Description of the Background Art

Liquid crystal display devices of a thin film transistor type, which will be referred to as "TFT-LCDs" hereinafter, have been improved to achieve larger sizes and higher definition. In accordance with this, interconnections made of alloy, which is primarily formed of aluminum and has a relatively low resistance, have been employed for preventing signal delay on the interconnections such as a gate bus-line.

A method of manufacturing a TFT-LCD in the prior art will now be described by way of example with reference to the drawings. Referring to FIG. 20, an aluminum alloy film (not shown) of about 200 nm in thickness is formed on a surface of a glass substrate 102 by a sputtering method. A predetermined photoresist pattern (not shown) is formed on the aluminum alloy film.

Etching with etching liquid, which is primarily made of phosphoric acid, acetic acid and nitric acid, is effected on the aluminum alloy film masked with the photoresist pattern described above. Thereby, a gate electrode 104b including a gate bus-line as well as a common line 104c are formed in an image display portion A, and a terminal interconnection 104a (i.e., an interconnection 104a on the terminal side) is formed in a terminal portion B.

Referring to FIG. 21, a silicon nitride film 106 having a thickness of about 400 nm is formed by a CVD method of the like on glass substrate 102 so that terminal interconnection 104a, gate electrode 104b and common line 104c are covered with silicon nitride film 106. Then, an amorphous silicon film of about 200 nm in thickness is formed on silicon nitride film 106. Further, an n$^+$-type amorphous silicon film of about 50 nm in thickness is formed.

A predetermined photoresist pattern (not shown) is formed on this n$^+$-type amorphous silicon film. Anisotropic etching is effected on the n$^+$-type amorphous silicon film and the amorphous silicon film masked with the photoresist pattern. Thereby, amorphous silicon films 107 and n$^+$-type amorphous silicon films 108 each having an isolated form are formed.

Referring to FIG. 22, a chrome film (not shown) of about 400 nm in thickness is formed by a sputtering method or the like on silicon nitride film 106 so that amorphous silicon film 107 and n$^+$-type amorphous silicon film 108 in the isolated form are covered with this chrome film. A predetermined photoresist pattern (not shown) is formed on the chrome film.

The chrome film thus masked with the photoresist pattern is etched to form drain electrodes 109a and source electrodes 109b. Thereafter, appropriate processing is performed to remove n$^+$-type amorphous silicon film 108 located on each amorphous silicon film 108 which will form a channel region. Thereby, Thin Film Transistors (TFTs) T each including gate electrode 104b, drain electrode 109a and source electrode 109b are formed.

Referring to FIG. 23, a silicon nitride film 110 which covers and thereby protects thin film transistors T is formed, e.g., by the CVD method. A predetermined photoresist pattern (not shown) is formed on silicon nitride film 110.

Anisotropic etching is effected on silicon nitride films 110 and 106 thus masked with the photoresist pattern so that contact holes 111a are formed to expose the surfaces of drain electrodes 109a, respectively. Contact holes 111b are also formed for exposing the surfaces of terminal interconnections 104a, respectively.

Referring to FIG. 24, a transparent and conductive film made of oxide such as an ITO (Indium Tin Oxide) film of about 100 nm in thickness is formed on silicon nitride film 110 by the sputtering method or the like so that contact holes 111a and 111b may be filled with this ITO film or the like. A predetermined photoresist pattern (not shown) is formed on the ITO film.

The ITO film thus masked with the photoresist pattern is etched with etching liquid containing hydrochloric acid and nitric acid so that pixel electrodes 113a are formed in image display portion A, and terminal electrodes 113b are formed in terminal portion B. Each pixel electrode 113a is electrically connected to drain electrode 109a of thin film transistor T. Each terminal electrode 113b is electrically connected to terminal interconnection 104a.

Then, a glass substrate and a color filter (both not shown) are disposed on the above structure with a sealing material (not shown) therebetween. Liquid crystal is supplied into a space between glass substrate 102 provided with thin film transistors T and the glass substrate covered with the color filter. Further, a drive IC (i.e., IC for driving) is mounted on a predetermined terminal portion. The TFT-LCD is completed through the manufacturing process described above.

In the TFT-LCD, as described above, alloy films primarily made of aluminum are used in the gate bus-lines including the gate electrodes, the terminal interconnections and others. The purpose of this is to prevent signal delays by employing the alloy primarily made of aluminum as materials of the electrodes and interconnections, and thereby reducing the resistances thereof.

In the conventional TFT-LCD, however, oxide aluminum is formed on the interface between terminal interconnection 104a and terminal electrode 113b particularly in the contact portion within contact hole 111b. Such oxide aluminum is probably formed, e.g., due to reaction, which occurs on the interface between terminal interconnection 104a made of the aluminum alloy and terminal electrode 113b made of the ITO film or another transparent and conductive oxide film, due to oxygen plasma processing after formation of the contact holes, or due to natural oxidization occurring as a result of exposure of the substrate to the atmosphere.

Since the oxide aluminum is formed in the contact portion as described above, a contact resistance may take on an extremely high value of 100 M$\Omega$ or more if the contact area is in a practical range. Therefore, good electric contact cannot be achieved between terminal electrode 113b and terminal interconnection 104a so that the TFT-LCD cannot operate appropriately.

Further, the etching liquid, which is used for forming pixel electrode 113a and terminal electrode 113b made of the ITO film, may spread into the structure through pinholes in silicon nitride films 110 and 106. Since the etching liquid contains hydrochloric acid and nitric acid as already described, terminal interconnection 104a and gate electrode 104b made of aluminum alloy may be etched or corroded.

For overcoming the above problems, therefore, such a structure is already proposed, e.g., in Japanese Patent Publication No. 7-113726 that a chrome film or the like is layered over the surfaces of terminal interconnection 104a and gate electrode 104b made of aluminum alloy. The chrome film thus layered provides good electric connection to the ITO film. Also, the chrome film has a sufficient resistance against chemical liquid, and therefore can protect the interconnections and others made of aluminum alloy.

For coating the surfaces of terminal interconnection 104a and gate electrode 104b made of aluminum alloy with another kind of metal film, however, a sputtering device must be provided with a metal target corresponding to such a metal film. For forming the interconnection and others, it is necessary to conduct different kinds of etching which correspond to the film qualities of the metal films, respectively. This increases the manufacturing cost, and also increases the number of manufacturing steps.

SUMMARY OF THE INVENTION

The invention has been developed for overcoming the foregoing problems, and first and second objects of the invention are to provide a semiconductor device and a liquid crystal display device, which are provided with electrodes or interconnections allowing easy reduction in contact resistance and having resistances against chemical liquid. A third object of the invention is to provide a method of manufacturing such a semiconductor device.

A semiconductor device according to a first aspect of the invention includes a substrate having a main surface, a first conductive layer and a second conductive layer. The first conductive layer is formed on the main surface of the substrate. The second conductive layer is formed on the main surface of the substrate, and is electrically connected to the first conductive layer. The first conductive layer is formed of layered films having a first layer primarily made of aluminum, and a second layer including aluminum containing nitrogen. The second layer of the first conductive layer and the second conductive layer are in direct contact with each other in a contact portion between the first and second conductive layers, and the second layer in the contact portion has a thickness determined to provide a predetermined contact resistance based on a specific resistance of the second layer.

According to the above structure, since the second layer of the first conductive layer in the contact portion has the predetermined thickness determined corresponding to the specific resistance value of the second layer, the contact resistance can be significantly reduced. As a result, the semiconductor device in which signal delay is prevented is achieved.

Preferably, the semiconductor device further includes an insulating film formed on the substrate and covering the first conductive layer, and a contact hole formed in the insulating film and exposing the surface of the first conductive layer, the contact portion is located within the contact hole, the second layer in the first conductive layer is formed on the first layer, and the second conductive layer is formed on the insulating film and in the contact hole.

In this case, the second layer include the aluminum containing the nitrogen, and therefore can protect the first layer, e.g., from chemical liquid such as etching liquid used for forming the second conductive layer. Consequently, it is possible to suppress corrosion of the interconnections and others while preventing the signal delay.

The second layer in the contact portion has the thickness d satisfying a relationship of $0<\rho\cdot d<3$ $\Omega\cdot\mu m^2$ in the case where the specific resistance $\rho$ of the second layer satisfies a relationship of $50<\rho\leq 1\times 10^5$ $\mu\Omega\cdot cm$, and satisfying a relationship of $0<d<3$ nm in the case where the specific resistance $\rho$ satisfies a relationship of $1\times 10^5$ $\mu\Omega\cdot cm<\rho$. The predetermined contact resistance R preferably satisfies a relationship of $R\cdot S<100$ $M\Omega\cdot\mu m^2$, where S represents an area of the contact portion. Thereby, the contact resistance can be equal to 100 K$\Omega$ or less, and desirably several kilohms when the contact area is in a practical range, and therefore the contact resistance in the contact portion can be remarkably reduced.

Preferably, the second layer outside the contact portion has the thickness T larger than that of the second layer in the contact portion.

This structure can reliably prevent chemical liquid such as etching liquid for forming the second conductive layer from spreading into the first layer of the first conductive layer, e.g., through pin-holes in the insulating film. As a result, the first conductive layer can have a good resistance against the chemical liquid.

Preferably, the crystal grain of aluminum of the first layer has a surface orientation of (111).

This structure promotes nitriding of the aluminum of the first layer, and a surface portion of the first layer having an appropriate thickness is nitrided in the process of forming the second layer including aluminum containing nitrogen. This improves the state of joining between the first and second layers in the interface, and reduces the contact resistance.

Preferably, the thickness T of the second layer satisfies a relationship of $0<d<20$ nm in the case of the specific resistance $\rho$ of the second layer satisfying a relationship of $50<\rho\leq 1\times 10^5$ $\mu\Omega\cdot cm$.

In this case, the second layer outside the contact portion has the thickness T smaller than 20 nm. Thereby, eaves of the second layer, which is formed due to difference in film quality between the first and second layers during formation of the first conductive layer, can have a more gentle form. Consequently, the second conductive layer, which is formed on the first conductive layer with the insulating film therebetween, can be prevented from being broken on the stepped portion formed by the eaves.

In the case of the thickness T satisfying a relationship of $T\geq 20$ nm, it is preferable that the insulating film has the thickness larger than 1 $\mu$m.

Owing to this increased thickness of the insulating film, it is possible to suppress breakage of the second conductive layer even when the second layer forms the eaves.

The insulating film described above preferably includes a transparent resin film, and the semiconductor device can be applied, e.g., to a liquid crystal display device or the like requiring light transparency.

More preferably, the second conductive layer includes a transparent conductive film.

In this case, the semiconductor device can be applied to the liquid crystal display device or the like.

According to a second aspect of the invention, a liquid crystal display device includes a transparent substrate having a main surface, a first conductive layer, an insulating film, a contact hole, and a transparent second conductive layer. The first conductive layer is formed on the main surface of the substrate. The insulating film is formed on the substrate and covers the first conductive layer. The contact hole is formed in the insulating film, and exposes the surface of the first conductive layer. The second conductive layer is formed on the insulating film, fills the contact hole, and is electrically connected to the first conductive layer. The first conductive layer has a lower layer portion primarily made of aluminum, and an upper layer portion layered on the lower layer portion and including aluminum containing nitrogen. The contact hole exposes the surface of the upper layer portion. The upper layer portion in the contact portion within the contact hole has a thickness determined to provide a predetermined contact resistance based on a specific resistance value of the upper layer portion.

According to this structure, since the upper layer portion of the first conductive layer in the contact portion has the predetermined thickness which is determined based on the specific resistance value of the upper layer portion, the contact resistance can be significantly reduced. Since the upper layer portion includes aluminum containing nitrogen, it is possible to protect the lower layer portion from chemical liquid such as etching liquid used for forming the second conductive layer. Consequently, it is possible to provide the liquid crystal display device, in which signal delay can be easily prevented, and corrosion of the interconnections and others can be suppressed.

The upper layer portion in the contact portion has the thickness d satisfying a relationship of $0 < \rho \cdot d < 3 \ \Omega \cdot \mu m^2$ in the case where the specific resistance $\rho$ of the upper layer portion satisfies a relationship of $50 < \rho \leq 1 \times 10^5 \ \mu\Omega \cdot cm$, and satisfying a relationship of $0 < d < 3$ nm in the case where the specific resistance $\rho$ satisfies a relationship of $1 \times 10^5 \ \mu\Omega \cdot cm < \rho$. The predetermined contact resistance R preferably satisfies a relationship of $R \cdot S < 100 \ M\Omega \cdot \mu m^2$, where S represents an area of the contact portion. Thereby, the contact resistance can be equal to 100 KΩ or less when the contact area is in a practical range, and desirably is equal to several kilohms or less, and therefore the contact resistance can be remarkably reduced.

According to a third aspect of the invention, a method of manufacturing a semiconductor device includes the following steps. Processing is performed to form on a substrate a first conductive layer having a lower layer portion primarily made of aluminum, and an upper layer portion layered on the lower layer portion and made of aluminum containing nitrogen. Processing is performed to form on the substrate an insulating film covering the first conductive layer. A contact hole exposing the surface of the upper layer portion is formed in the insulating film. Processing is performed to form on the insulating film a second conductive layer electrically connected to the upper layer portion exposed on the bottom of the contact-hole. In the step of forming the contact hole, the upper layer portion in the contact portion is determined to have a predetermined thickness so as to provide a predetermined contact resistance based on the specific resistance value of the upper layer portion.

According to this method, since the predetermined thickness of the upper layer portion in the contact portion is determined based on the specific resistance of the upper layer portion in the step of forming the contact hole, the contact resistance can be significantly reduced. Since the upper layer portion includes aluminum containing nitrogen, it is possible to protect the lower layer portion of the first conductive layer from chemical liquid such as etching liquid used for forming the second conductive layer. Consequently, it is possible to manufacture the semiconductor device, in which signal delay can be easily prevented, and corrosion of the interconnections and others can be suppressed.

Preferably, the upper layer has the thickness d satisfying a relationship of $0 < \rho \cdot d < 3 \ \Omega m^2$ in the case where the specific resistance $\rho$ of the upper layer portion satisfies a relationship of $50 < \rho \leq 1 \times 10^5 \ \mu\Omega \cdot cm$, and satisfying a relationship of $0 < d \leq 3$ nm in the case where the specific resistance $\rho$ satisfies a relationship of $1 \times 10^5 \ \mu\Omega \cdot cm < \rho$. Thereby, the contact resistance can be equal to 100 KΩ or less when the contact area is in a practical range, and desirably is equal to several kilohms or less, and therefore the contact resistance can be remarkably reduced.

Preferably, the upper layer portion is formed in a nitrogen atmosphere by a sputtering method under the conditions of $0.1 < F/D \leq 10$ ml/nm where F represents a flow rate of the nitrogen supplied into the atmosphere in contact with the substrate, and D represents a growth rate of the upper layer portion (conditions of $0.1 < F/D \leq 10$ ml/nm will be referred to as conditions A, and conditions of $1 < F/D < 10$ ml/nm will be referred to as conditions B, hereinafter).

Under the above conditions A, the upper layer portion has a relatively low specific resistance, and the predetermined contact resistance can be achieved while keeping a large margin of the thickness of the upper layer portion. Under the conditions B, the upper layer portion has a relative high specific resistance, and a resistance can be kept against chemical liquid such etching liquid, e.g., for forming the second conductive layer.

Under the conditions A described above, since the margin of the thickness of the upper layer portion is large, it is preferable that the growth rate D of the upper layer portion satisfies a relationship of $3 < D < 60$ nm/min.

Under the conditions B, however, the specific resistance is relatively high so that the thickness achieving the predetermined contact resistance can be selected only from a relatively narrow range. In this case, the growth rate D of the upper layer portion preferably satisfies a relationship of $3 < D < 10$ nm/min.

Preferably, formation of the lower layer portion starts after the pressure decreases to or below $10^{-3}$ Pa.

This feature can remarkably suppress formation of aluminum oxide between the lower and upper layer portions.

Preferably, the substrate is exposed to an atmosphere containing oxygen in a concentration of $10^{-10}$ mol/l or less for a period from start of formation of the lower layer portion to end of formation of the upper layer portion.

In this case, it is likewise possible to suppress reliably the formation of aluminum oxygen between the lower and upper layer portions.

Preferably, the upper layer portion is formed in an atmosphere containing a nitriding gas nitriding aluminum. The nitriding gas may preferably contain a gas containing at least one of nitrogen, ammonia, hydrazine and hydrazone.

Preferably, a scan magnetron sputtering device is used for the first conductive layer.

According to the scan magnetron sputtering device, a distribution of thickness of the first conductive layer formed on the substrate can be controlled by an oscillating speed of a magnet, and therefore the thickness of the first conductive layer within the surface of the substrate can be easily controlled.

Preferably, the step of forming the contact hole includes supply of a nitriding gas nitriding aluminum before the lower layer portion is exposed.

In this case, even when the etching for forming the contact hole removes the upper layer portion to expose the surface of the lower layer portion, a nitrogen-containing aluminum film is formed at the surface of the lower layer portion owing to the supply of the nitriding gas. Thereby, increase in the contact resistance can be suppressed.

Preferably, the step of forming the first conductive layer includes a step of patterning the first conductive layer by dry etching.

In this case, it is possible to eliminate eaves of the upper layer portion, which may be caused due to difference in film quality between the upper and lower layer portions, in contrast to the case of performing wet etching for patterning. As a result, the second conductive layer formed on the first conductive layer can be prevented from being broken on a stepped portion of the first conductive layer.

It is desired that the nitrogen used as the nitriding gas is in advance mixed and diluted with an inert gas within a gas cylinder.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
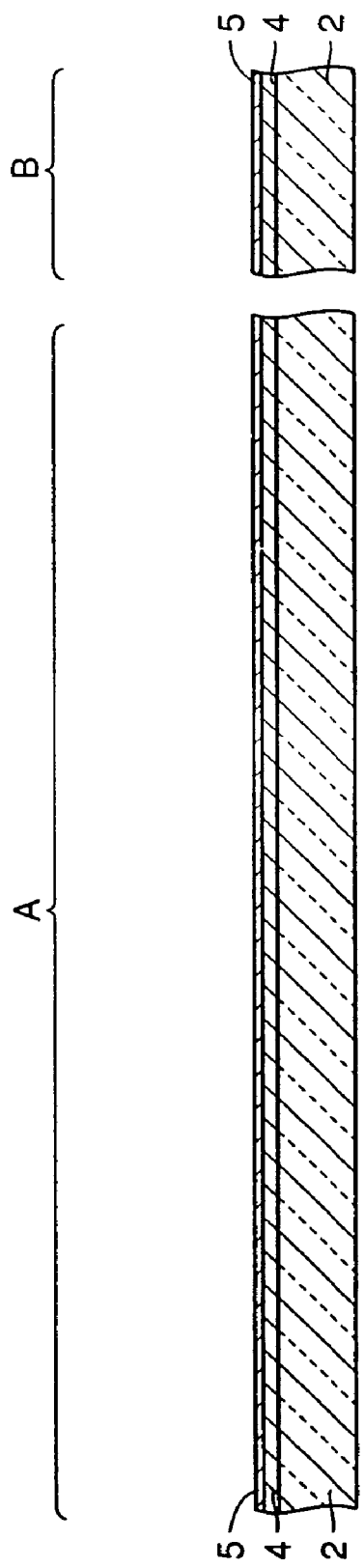
FIG. 1 is a cross section showing a first step in a method of manufacturing a liquid crystal display device according to a first embodiment of the invention.

A liquid crystal display device according to a first embodiment of the invention will now be described. First, a manufacturing method will be described below with reference to the drawings. Referring to FIG. 1, a target material of aluminum alloy is sputtered onto a glass substrate 2, which has an image display portion A and a terminal portion B, in a chamber of a scan magnetron sputtering device (which will be referred to as a "sputtering device" hereinafter) so that an aluminum alloy film 4 having a thickness of about 200 nm and containing, e.g., 0.2 wt % of copper is formed on glass substrate 2.

Glass substrate 2 is kept within the chamber, and a target material of aluminum alloy is sputtered while supplying a nitrogen gas diluted with an argon gas into the chamber. Thereby, a nitrogen-containing aluminum film 5 (i.e., aluminum film 5 containing nitrogen) is formed on aluminum alloy film 4.

Nitrogen-containing aluminum film 5 is formed under the following conditions. The sputtering device has a DC power of 1 KW. A diluted nitrogen gas which is a gas mixture of argon (Ar) and 10% of $N_2$ contained in a gas cylinder is used as the nitrogen gas to be supplied into the chamber. The flow rate of this gas mixture is equal to 50 sccm. Thus, a net flow rate F of the nitrogen gas is equal to 5 sccm. The film forming or depositing time is controlled so that nitrogen-containing aluminum film 5 may have a thickness of about 12 nm, and control is also performed to grow nitrogen-containing aluminum film 5 at a growth rate D of about 20 nm/min.

The formation of nitrogen-containing aluminum film 5 starts when the pressure in the chamber which is not yet supplied with the gas mixture decreases to $10^{-3}$ Pa or less. The concentration of oxygen in the chamber is kept at $10^{-10}$ mol/l or less for a period after the start of formation of aluminum alloy film 4 to the end of formation of nitrogen-containing aluminum film 5.

Figure 2:
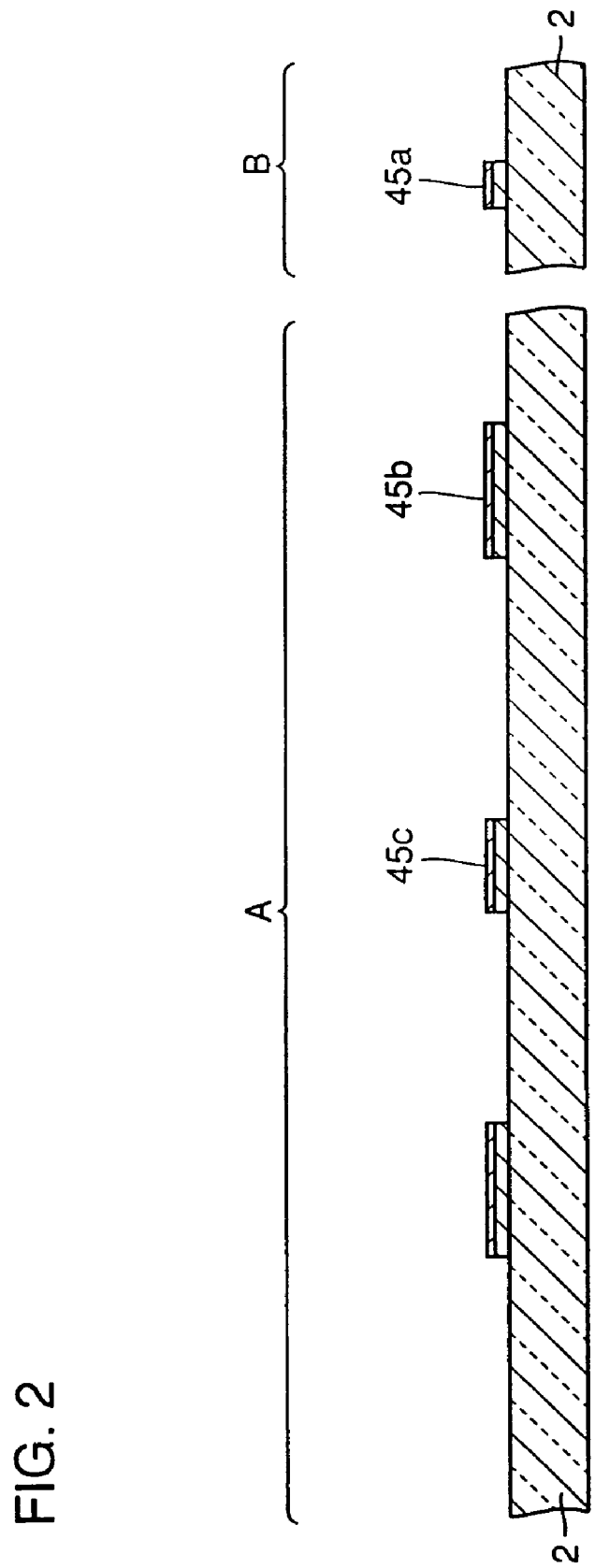
FIG. 2 is a cross section showing a step performed after the step shown in FIG. 1 according to the first embodiment.

Referring to FIG. 2, a predetermined photoresist pattern (not shown) is formed on nitrogen-containing aluminum film 5. Using the photoresist pattern as a mask, etching is effected on nitrogen-containing aluminum film 5 and aluminum alloy film 4 with etching liquid primarily made of phosphoric acid, acetic acid and nitric acid so that gate electrodes 45b each including a gate bus-line as well as common lines 45c are formed in image display portion A. Also, terminal interconnections 45a (i.e., interconnections 45a on the terminal side) ale formed in terminal portion B. Thereafter, the photoresist pattern is removed.

Figure 3:
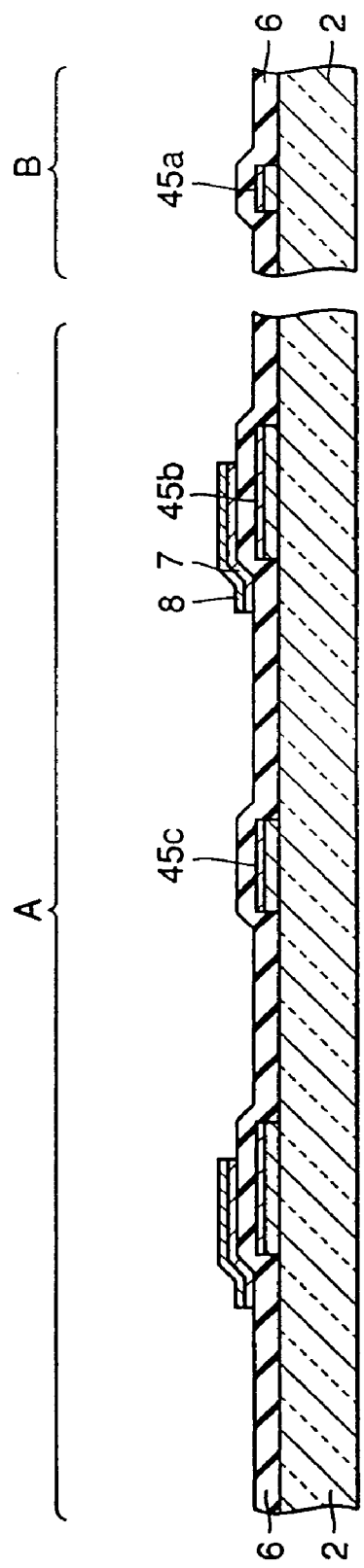
FIG. 3 is a cross section showing a step performed after the step shown in FIG. 2 according to the first embodiment.

Referring to FIG. 3, a silicon nitride film 6 of about 400 nm in thickness is formed, e.g., by a plasma CVD method over terminal interconnections 45a, gate electrodes 45b and common lines 45c. Subsequently, an amorphous silicon film of about 200 nm in thickness is formed. Further, an $n^+$-amorphous silicon film of about 50 nm in thickness is formed.

A predetermined photoresist pattern (not shown) is formed on the $n^+$-amorphous silicon film. Using the photoresist pattern as a mask, etching is effected on the $n^+$-amorphous silicon film and the amorphous silicon film so that amorphous silicon films 7 and $n^+$-amorphous silicon films 8 each taking the isolated form are formed. Each amorphous silicon film 7 in the isolated form will form a channel portion of a thin film transistor which will be completed later.

Figure 4:
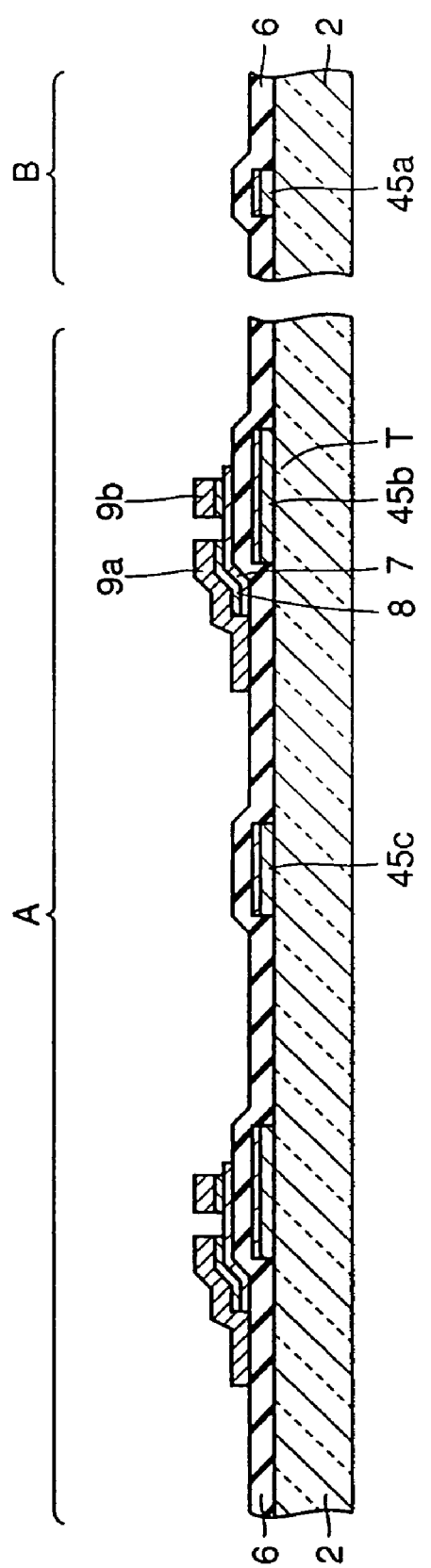
FIG. 4 is a cross section showing a step performed after the step shown in FIG. 3 according to the first embodiment.

Referring to FIG. 4, a chrome film (not shown) of about 400 nm in thickness is formed by a sputtering method over each amorphous silicon film 7 and $n^+$-amorphous silicon film 8 in the isolated form. A predetermined photoresist pattern (not shown) is formed on this chrome film.

Using the photoresist pattern as a mask, etching is effected on the chrome film to form drain electrodes 9a and source electrodes 9b. Then, dry etching is effected to remove $n^+$-amorphous silicon film 8 on each channel region. Thereafter, the photoresist pattern is removed. Thereby, thin film transistors T each including gate electrode 45b, drain electrode 9a and source electrode 9b is formed.

Figure 5:
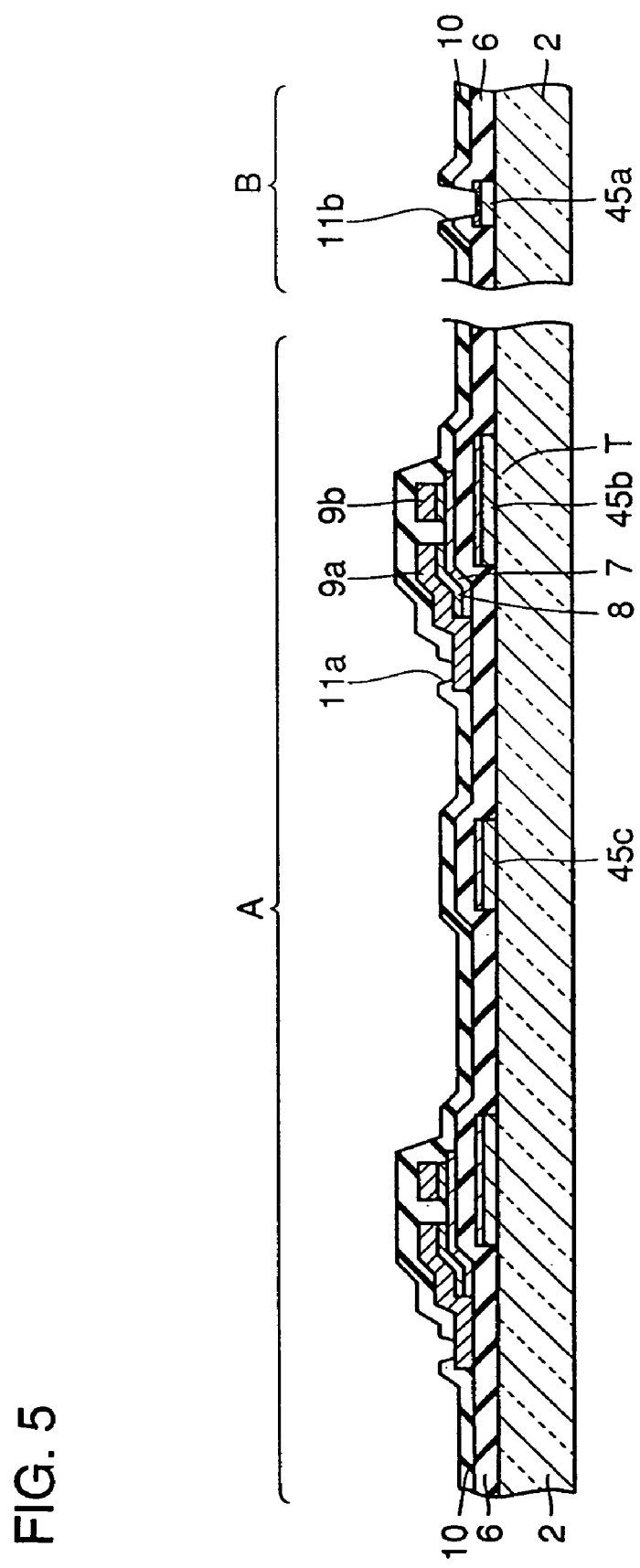
FIG. 5 is a cross section showing a step performed after the step shown in FIG. 4 according to the first embodiment.

Referring to FIG. 5, a silicon nitride film 10 covering each thin film transistor T is formed on silicon nitride film 6 by the CVD method or the like. A predetermined photoresist pattern (not shown) is formed on silicon nitride film 10.

Using the photoresist pattern as a mask, anisotropic etching is effected on silicon nitride films 10 and 6 to form contact holes 11a each exposing the surface of drain electrode 9a and contact holes 11b each exposing the surface of terminal interconnection 45a.

This anisotropic etching is performed with an etching gas containing $CF_4$ or $SF_6$. The overetching is performed at a rate of about 30%. This value is determined for preventing such a disadvantage particularly in contact hole 11b that the thickness of nitrogen-containing aluminum film 5 exposed on the bottom of contact hole 11b is reduced below the intended range due to the overetching.

Figure 6:
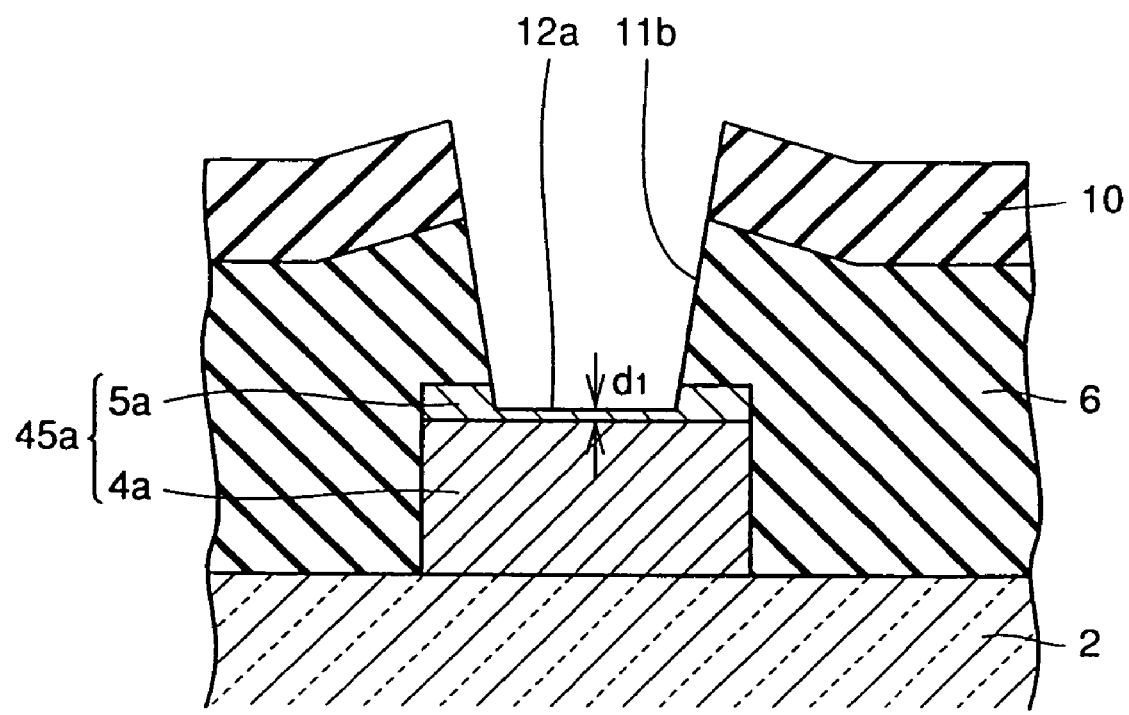
FIG. 6 is a fragmentary cross section showing, on an enlarged scale, a step performed after the step shown in FIG. 5 according to the first embodiment.

In this step, as shown in FIG. 6, nitrogen-containing aluminum film 5a in a contact portion 12a within contact hole 11b has a thickness $d_1$ of a predetermined value, which is determined to provide a predetermined contact resistance in accordance with a value of a specific resistance of nitrogen-containing aluminum film 5a, as will be described later.

Figure 7:
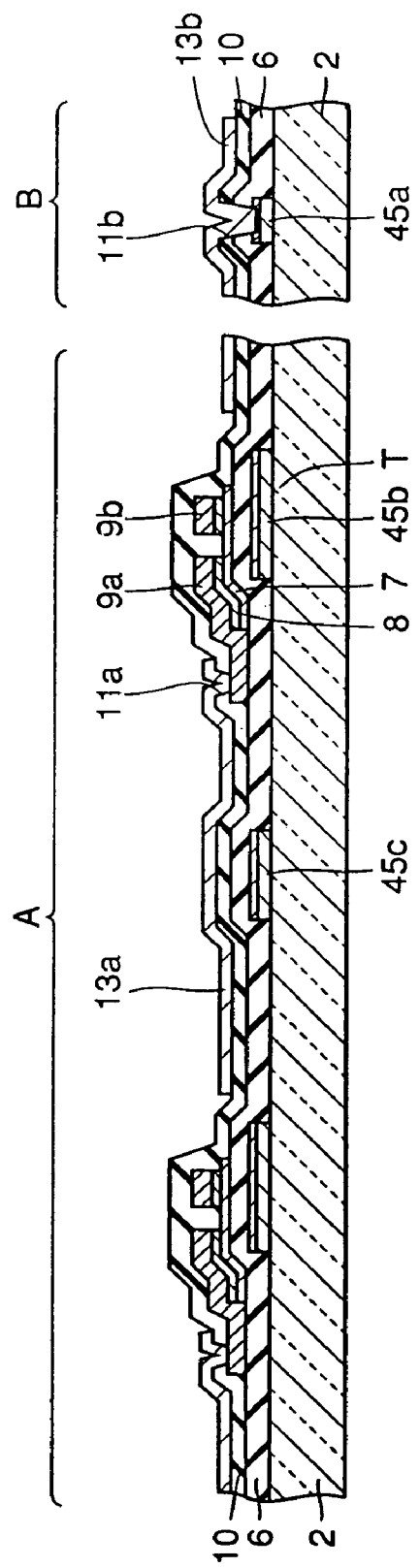
FIG. 7 is a cross section showing a step performed after the step shown in FIG. 5 according to the first embodiment.

Referring to FIG. 7, a sputtering method or the like is performed to form an ITO film (not shown) of about 100 nm in thickness, which fills contact holes 11a and 11b, on silicon nitride film 10. A predetermined photoresist pattern is formed on this ITO film.

The ITO film thus masked with the photoresist pattern is etched with etching liquid containing hydrochloric acid and nitric acid so that pixel electrodes 13a are formed in image display portion A. Also, terminal electrodes 13b are formed in terminal portion B. Each pixel electrode 13a is electrically connected to source electrode 9a. Terminal electrode 13b is electrically connected to terminal interconnection 45a.

For stabilizing the characteristics of thin film transistor T, annealing is performed at a temperature from 130° C. to 300° C. This annealing temperature affects the contact resistance in the contact portion, and therefore it is important to avoid excessive increase in annealing temperature. In this embodiment, the annealing temperature is 250° C.

Figure 8:
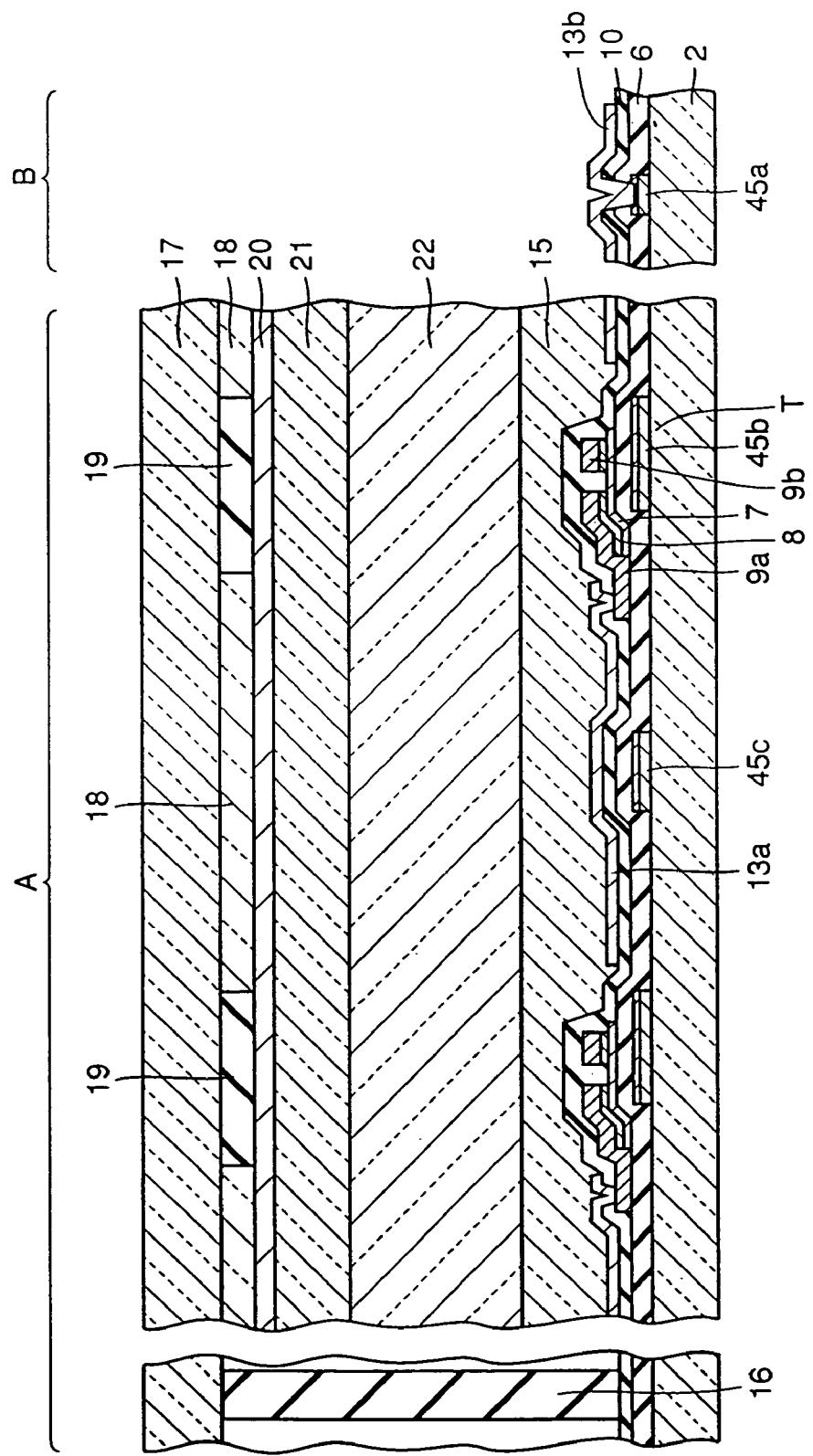
FIG. 8 is a cross section showing a step performed after the step shown in FIG. 7 according to the first embodiment.

Referring to FIG. 8, an orientation film 15 covering pixel electrode 13a is formed on silicon nitride film 10. A glass substrate 17 is arranged on glass substrate 2 provided with orientation film 15 with a sealing member 16 therebetween. Glass substrate 17 is already provided with a color member 18, a black matrix 19, an ITO film 20 and an orientation film 21.

Figure 9:
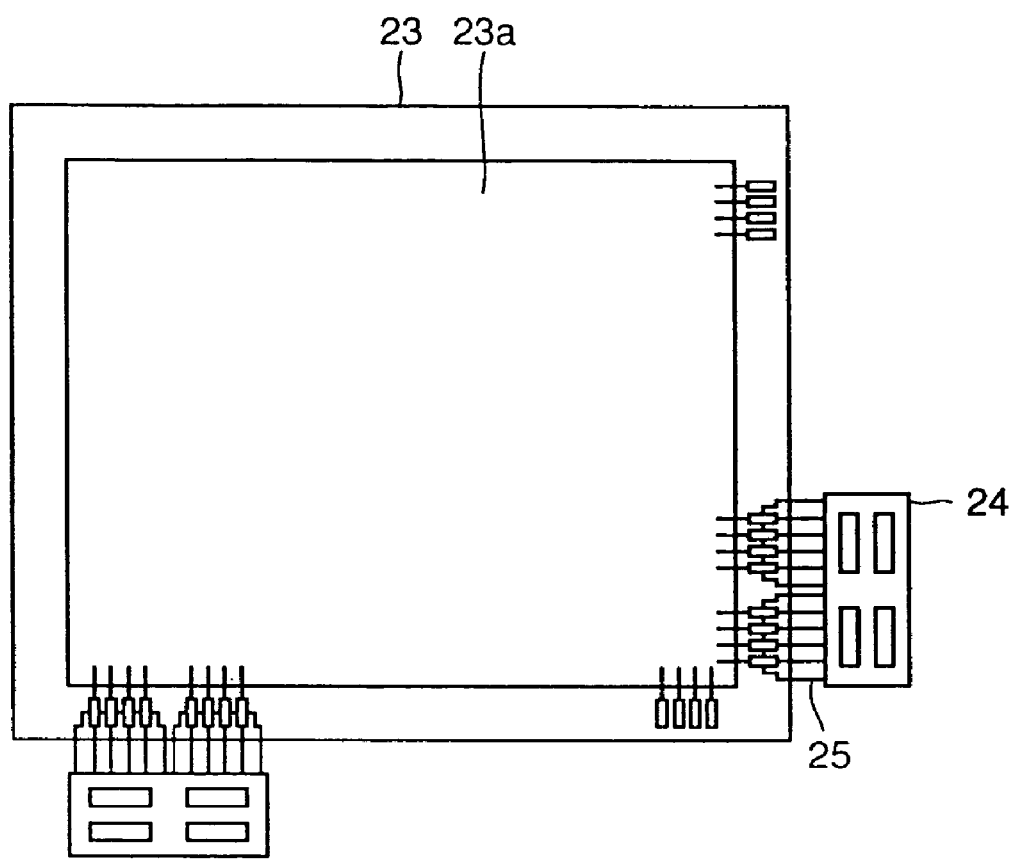
FIG. 9 is a cross section showing a step performed after the step shown in FIG. 8 according to the first embodiment.

Liquid crystal 22 is supplied into a space between orientation films 15 and 21. Then, as shown in FIG. 9, a drive IC substrate 24 carrying drive ICs (i.e., ICs for drive) is mounted on a liquid crystal panel 23. Drive IC substrate 24 and liquid crystal panel 23 are electrically connected together by a flexible printed circuit 25. Through the steps described above, the liquid crystal display device provided with liquid crystal panel 23 is completed.

According to the liquid crystal display device thus formed, since nitrogen-containing aluminum film 5a of a predetermined thickness is present on the interface between terminal electrode 13b formed of the ITO film and terminal interconnection 45a, the contact resistance can be significantly reduced.

Figure 10:
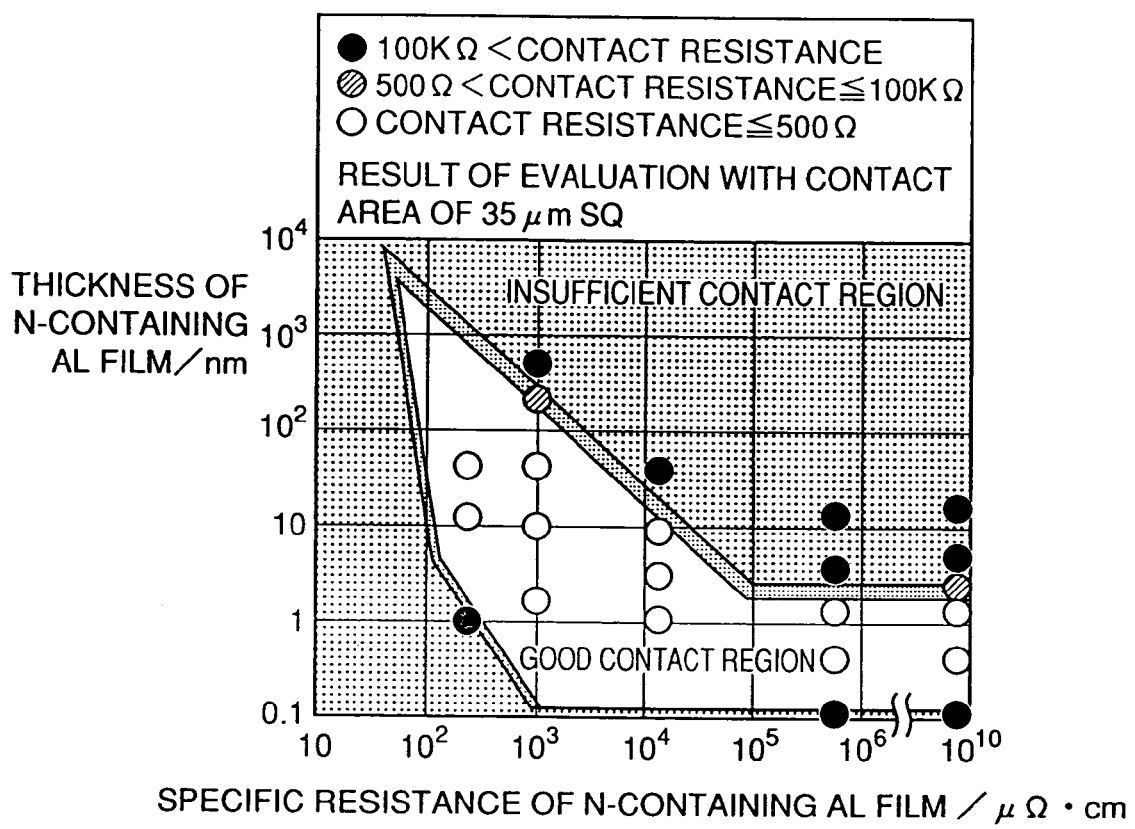
FIG. 10 is a graph showing a distribution of contact resistance with respect to the thickness of a nitrogen-containing aluminum film and a specific resistance according to the first embodiment.

This will be described below in greater detail. FIG. 10 shows a result of evaluation relating to the contact resistance of the contact portion in the contact hole having a size of 35 $\mu$m square, and particularly a result of evaluation of the dependency of the above contact resistance on the thickness of the nitrogen-containing aluminum film and the specific resistance thereof. In FIG. 10, blank circles represent points where the contact resistance is lower than 500 Ω. Hatched circles represent points where the contact resistance is in a range between 500 Ω to 100 KΩ. Solid circles represent points where the contact resistance is larger than 100 kΩ.

According to the results of measurement in FIG. 10, a blank region (region A) in FIG. 10 represents a region where the contact resistance R is relatively low (R≦500 Ω). A closely hatched region B represents a region where the contact resistance is between 500 Ω and 100 KΩ. A coarsely hatched region C represent a region where the contact resistance is larger than 100 KΩ.

The contact resistance is desirably 100 KΩ or less, and more desirably 500 Ω or less. Therefore, it has been found that the thickness and specific resistance of nitrogen-containing aluminum film 5 must be determined to be within the region A or B.

More specifically, it has been found that the thickness d of the nitrogen-containing aluminum film is merely required to satisfy a relationship of $0<\rho\cdot d<3$ Ω·$\mu m^2$ in the case where a specific resistance $\rho$ of nitrogen-containing aluminum film 5 satisfies a relationship of $50<\rho\leq 1\times 10^5$ $\mu$Ω·cm.

Also, it has been found that the thickness d of the nitrogen-containing aluminum film is merely required to satisfy a relationship of $0<d<3$ nm in the case where specific resistance $\rho$ of the nitrogen-containing aluminum film satisfies a relationship of $1\times 10^5$ $\mu$Ω·cm$<\rho$.

The above range of the thickness can provide a desired contact resistance even if the value of specific resistance $\rho$ increases to about $1\times 10^{10}$ $\mu$Ω·cm, and this is already confirmed by an experiment.

FIG. 10 shows the results in the case where the contact hole has a size of 35 μm square. However, it has been found that contact resistance R is merely required to satisfy a relationship of R·S<100 μMΩ·μm² where S represents an area of the contact portion.

Thereby, the contact resistance can be set to 100 KΩ or less, and desirably several kilohms when the contact area is of a practical value.

By setting the thickness of the nitrogen-containing aluminum film in the contact portion to the foregoing value, it is possible to reduce remarkably the contact resistance in the contact portion between terminal interconnection 45a and terminal electrode 13b. As a result, signal delay in the liquid crystal display device can be prevented.

The above result can be utilized for the nitrogen-containing aluminum film remaining in the contact portion after formation of the contact hole. Thereby, results similar to those shown in FIG. 10 can be probably achieved even in connection with contact resistances of contact holes having different sizes.

In this liquid crystal display device, nitrogen-containing aluminum film 5 is layered on aluminum alloy film 4 of terminal interconnection 45a. This structure can prevent etching and corrosion of aluminum alloy film 4, e.g., by etching liquid during formation of pixel electrode 13a and terminal electrode 13b.

According to this embodiment, conditions for forming nitrogen-containing aluminum film 5 are determined so that nitrogen flow rate F and film growth rate D may satisfy a relationship of (F/D=0.25 ml/nm (F/D=0.025 ml/Å).

Particularly, nitrogen-containing aluminum film 5 which is formed with F/D ranging from 0.1 to 1 ml/nm (0.01–0.1 ml/Å) has a relatively low specific resistance. As the specific resistance of nitrogen-containing aluminum film 5 lowers, the thickness can be increased while achieving a good contact resistance, as can be seen from FIG. 10.

Accordingly, a high accuracy of the thickness is not required in the plane of glass substrate 2 when forming nitrogen-containing aluminum film 5 on glass substrate 2. When the value of F/D is in the foregoing range, the specific resistance of the nitrogen-containing aluminum film takes on the value of about 500 μΩ·cm, and the contact resistance takes on the value of 500 Ω or less when the nitrogen-containing aluminum film has a thickness in a practical range from about several nanometers to about 100 nanometers.

The thickness of nitrogen-containing aluminum film 5 layered on aluminum alloy film 4 is determined as follows.

First, the nitrogen-containing aluminum film is etched by an amount from 5 to 10 nm due to dry etching performed for forming contact hole 11b shown in FIG. 5 or 6. This amount of etching is taken into consideration so that thickness $d_1$ of nitrogen-containing aluminum film 12 in contact portion 12a may fall within an intended range shown in FIG. 10.

Consideration is given to a form or configuration of patterning of terminal interconnection 45a and gate electrode 45d including the gate bus-line. An eaves of the nitrogen-containing aluminum film may be formed in the step shown in FIG. 2 for patterning nitrogen-containing aluminum film 5 and aluminum alloy film 4 by wet etching. This eaves is formed due to film quantities and, more specifically, a difference in etching rate between nitrogen-containing aluminum film 5 and aluminum alloy film 4.

In this case, the eaves of the nitrogen-containing aluminum film can be reduced by minimizing the thickness of nitrogen-containing aluminum film 5, e.g., to 20 nm or less.

Taking this into consideration, the thickness of nitrogen-containing aluminum film 5 is set, e.g., to about 12 nm. With this value of thickness, a product of specific resistance ρ of the nitrogen-containing aluminum and thickness d of the nitrogen-containing aluminum film does not fall outside a range of 0<ρ·d<3 Ω·μm² even when the thickness of the nitrogen-containing aluminum film and/or the value of specific resistance, e.g., in a peripheral portion of glass substrate 2 deviate from the target values, respectively. Thereby, the contact resistance value in the contact portion can be set to a relatively low value of 100 KΩ or less, and more preferably 500 Ω or less.

The eaves of the nitrogen-containing aluminum film is further reduced, and therefore it is possible to prevent breakage of pixel electrode 13a and others formed on the stepped portion, e.g., of gate electrode 45b.

The process described above was used for manufacturing a liquid crystal display device. Thereby, it was found that a reduced contact resistance can be easily achieved between a transparent electrode such as terminal electrode 13b and an aluminum alloy interconnection of, e.g., terminal interconnection 45a, of which stable formation is impossible in mass-production processes, e.g., of large liquid crystal display devices. Further, liquid crystal display devices having large screens such as 15-inch or more diagonal screens can be stably manufactured through a process requiring an extremely small number of photoengraving steps.

The process described above can be applied not only to large liquid crystal display devices but also to mid-sized liquid crystal display devices with 15-inch or less diagonal screens, which can be manufactured by preparing multiple substrates from a large substrate. As compared with high-melting-point metal which has been used as materials of interconnections and electrodes in the prior art, the target loaded in the sputtering device can be inexpensive owing to use of aluminum alloy, and therefore a manufacturing cost can be reduced. The etching liquid for patterning aluminum alloy film and others is inexpensive, which also allows reduction in manufacturing cost.

In all the liquid crystal display devices each including a divided substrate produced from the large single substrate, good contact resistances can be stably achieved, and therefore a productivity can be improved.

In the process of forming aluminum alloy film 4 and nitrogen-containing aluminum film 5, it is desired to take the following measures for suppressing formation of a coating film of aluminum oxide over aluminum alloy film 4.

It is desired that the concentration of oxygen in the chamber is kept at $10^{-10}$ mold or less for a period from the start of formation of aluminum alloy film 4 to the end of formation of nitrogen-containing aluminum film 5.

It is desired that the nitrogen-containing aluminum film is formed without supplying an atmospheric air into the chamber after the pressure of $10^{-3}$ Pa or less is set in the chamber before formation of the nitrogen-containing aluminum film.

Particularly, it is desired to use a scan magnetron sputtering device for uniformly forming the nitrogen-containing aluminum film on the surface of glass substrate 2. In this case, it is desired that the growth rate of the nitrogen-containing aluminum film is in a range from 3 to 60 nm/min to allow at least multiple times of scanning by a magnet in the scan magnetron sputtering device so that the thickness of the nitrogen-containing aluminum film may fall within a range from 5 to 20 nm. The growth rate in this range allows uniform distributions of the thickness and quality within glass substrate 2.

By using the nitrogen gas which is already mixed and diluted uniformly with an argon gas in a gas cylinder, the nitrogen can be uniformly supplied to the surface of glass substrate 2 in the chamber in spite of the fact that the flow rate of nitrogen is extremely small. This allows precise control of an extent to which sputtered aluminum particles are nitrided, and therefore can improve the uniformity in specific resistance of nitrogen-containing aluminum film 2 on the plane of glass substrate 2.

The above embodiment has been described in connected with the case where nitrogen-containing aluminum film 5 has a relatively low resistance (about $1\times10^5$ μΩ·cm or less). Even in the case where the nitrogen-containing aluminum film having the specific resistance larger than that described above is to be formed, a good contact resistance can likewise be achieved by providing the nitrogen-containing aluminum film of the thickness of about 3 nm or less in the contact portion as shown in FIG. 10.

The nitrogen-containing aluminum film having a relatively high specific resistance can be formed by setting a ratio F/D between nitrogen flow rate F and film growth rate D to a value within a range from 1 to 10 ml/nm (0.1–1 ml/Å). More specifically, the nitrogen-containing aluminum film having a relatively high specific resistance can be formed by the sputtering method performed under the conditions where a DC power is 1 KW, and a flow rate of the gas mixture of argon and nitrogen is 150 sccm (net flow rate F of the nitrogen gas is 15 sccm).

In this case, the nitrogen-containing aluminum film grows at growth rate D of about 7 nm/min. The film forming time is controlled to provide the nitrogen-containing aluminum film of about 7 nm in thickness.

If the specific resistance is relatively high, the thickness which can achieve the good contact resistance in the contact portion is restricted in a considerably narrow range. Therefore, it is necessary from the start of processing to control the thickness of the nitrogen-containing aluminum film on the plane of glass substrate 2 with an accuracy of ±1 nm. For achieving this accuracy, it is desired that the film growth rate of the nitrogen-containing aluminum film is in a range from 3 to 10 nm/min.

In this case, it is necessary to control the amount of etching of the nitrogen-containing aluminum film, which is caused by the dry etching for forming the contact hole, and more specifically to control this etched amount to a value from 4 to 6 nm. Therefore, it is necessary to reduce thicknesses of silicon nitride film 6 forming the gate insulating film and silicon nitride film 10 forming the interlayer insulating film.

Since the nitrogen-containing aluminum film has the further reduced thickness of about 7 nm, it is possible to prevent substantially an influence by the eaves of the nitrogen-containing aluminum film, which occurs due to wet etching for patterning terminal interconnection 45*a* and gate electrode 45*b*.

This embodiment employs the nitrogen gas for forming nitrogen-containing aluminum film 5. However, a gas other than the nitrogen gas can be used, and more specifically, a gas of at least one of ammonia, hydrazine and hydrazone may be used provided that it is a nitriding gas capable of nitriding aluminum.

For providing the uniform thickness and uniform specific resistance of the nitrogen-containing aluminum film in the plane of glass substrate 2, a target of aluminum which contains nitrogen may be loaded in the sputtering device for forming the nitrogen-containing aluminum film. In this case, a flow of the nitriding gas already described may be supplied so that the nitrogen-containing aluminum film formed on glass substrate 2 can be compensated for lack of nitrogen (N), and it is possible to provide nitrogen-containing aluminum film 5 having the specific resistance close to the specific resistance of the target material.

Instead of forming nitrogen-containing aluminum film 5 on aluminum alloy film 4, the nitrogen-containing aluminum film may be formed by nitriding the surface of aluminum alloy film 4.

For example, a nitriding gas such as a gas of nitrogen, ammonia, hydrazine or hydrazone is supplied into the chamber after formation of aluminum alloy film 4, and annealing is performed at a temperature of 100° C. or more so that the nitrogen-containing aluminum film is formed at the surface of aluminum alloy film 4.

By generating plasma from the nitrogen gas, a nitriding speed of the aluminum alloy film can be increased, and the nitrogen-containing aluminum film can be formed within a further reduced time.

In the foregoing methods, the concentration of oxygen in the chamber is set to $10^{-10}$ mol/l or less, and the substrate is transported between the chambers through a preliminary chamber in which the pressure in the sputtering device is equal to $10^{-3}$ Pa or less. Thereby, the concentration of oxygen to which the substrate is exposed can be kept at $10^{-16}$ mol/l or less for a period from the start of formation of the aluminum film to the end of formation of the nitrogen-containing aluminum film.

The crystal grain of aluminum alloy film 4 may have a surface orientation of (111). This promotes nitriding of the aluminum, and the aluminum alloy film can be nitrided through an appropriate thickness before formation of the nitrogen-containing aluminum film. This improves a joining state of the interface between nitrogen-containing aluminum film 5 and aluminum alloy film 4, and therefore can reduce the contact resistance.

The nitrogen-containing aluminum film may be a nitrided aluminum film, which is an example of a compound of the aluminum and the nitrogen. In addition to this, similar effects are probably achieved by an aluminum film, in which nitrogen is solely present in the aluminum film, as well as a film such as a nitrogen-containing aluminum film, in which nitrogen is solely present in the film.

Second Embodiment

In the foregoing liquid crystal display device according to the first embodiment, the nitrogen-containing aluminum film formed on the aluminum alloy film is relatively thin. A liquid crystal display device according to a second embodiment, which will now be described, employs the nitrogen-containing aluminum film which is relatively thick.

First, a manufacturing method will be described. Steps similar to those in the first embodiment, which are described with reference to FIG. 1, are conducted to form aluminum film 4 and nitrogen-containing aluminum film 5 on glass substrate 2.

In the above process, nitrogen-containing aluminum film 5 is formed under the following conditions. The sputtering device has a DC power of 1 KW. A diluted nitrogen gas which is a gas mixture of argon (Ar) and 20% of $N_2$ contained in a gas cylinder is used as the nitrogen gas to be supplied into the chamber. The flow rate of this gas mixture is equal to 50 sccm. Thus, a net flow rate F of the nitrogen gas is equal to 10 sccm. The film forming or depositing time is controlled to increase the thickness of nitrogen-containing aluminum film 5 to about 25 nm. Thereby, the nitrogen-containing aluminum film having a relatively high specific resistance ($1\times10^5$ $\mu\Omega\cdot$cm or less) is formed.

The aluminum alloy film is made of aluminum alloy, e.g., containing 0.2 wt % of copper.

Thereafter, steps similar to those in the first embodiment shown in FIGS. 2 to 4 are conducted, and silicon nitride film 10 covering thin film transistor T is formed by a step similar to that shown in FIG. 5.

Anisotropic etching is effected on silicon nitride films 10 and 6 masked with a predetermined photoresist pattern so that contact holes 11a and 11b are formed. In this processing, a gas mixture of $CF_4$ and $O_2$ or a gas mixture of $SF_6$ and $O_2$ is used as an etching gas.

Figure 11:
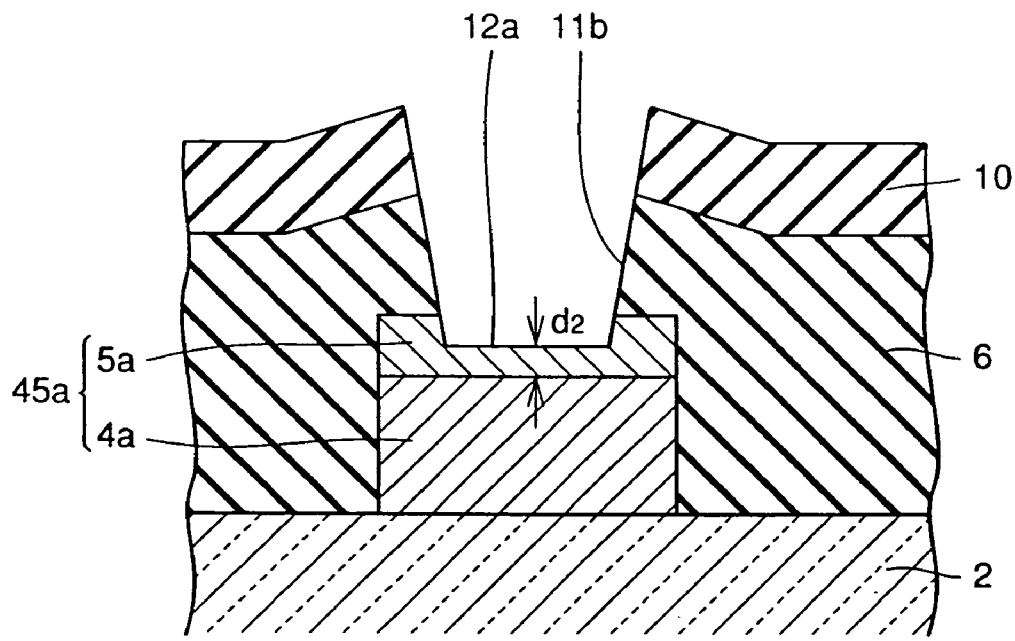
FIG. 11 is a fragmentary cross section showing, on an enlarged scale, a step performed in a method of manufacturing a liquid crystal display device according to a second embodiment of the invention.

In this step, as shown in FIG. 11, the rate of overetching is set to 125% in view of the initial thickness (25 nm) of the nitrogen-containing aluminum film and its etching rate of about 5 nm/min so that the nitrogen-containing aluminum film in contact portion 12a may have a predetermined thickness $d_2$ when forming contact hole 11b. Thereby, the nitrogen-containing aluminum film in contact portion 12a can have a thickness $d_2$ of about 10 nm.

Then, steps similar to those employed in the first embodiment and shown in FIGS. 7 to 9 are conducted so that the liquid crystal display device is completed.

According to the liquid crystal display device thus manufactured, thickness $d_2$ of nitrogen-containing aluminum film 5 in contact portion 12a is set to the predetermined value in accordance with the value of specific resistance of nitrogen-containing aluminum film 5.

If nitrogen-containing aluminum film 5 has thickness $d_2$ of about 10 nm, nitrogen-containing aluminum film 5 has the specific resistance of about $1\times10^5$ $\mu\Omega\cdot$cm or less, and the contact resistance in contact portion 12 can be set to a relatively low preferable value not exceeding 100 K$\Omega$ and more preferably not exceeding 500 $\Omega$ as shown in FIG. 10. Thereby, signal delay can be prevented similarly to the liquid crystal display device of the first embodiment.

In addition to the effects which can be achieved by the liquid crystal display device of the first embodiment, the liquid crystal display device of the second embodiment can achieve the following effects.

According to the liquid crystal display device of the second embodiment, the nitrogen-containing aluminum film outside the contact portion has a thickness larger than that (about 12 nm) of the nitrogen-containing aluminum film in the liquid crystal display device of the first embodiment. Therefore, even if chemical liquid such as etching liquid used for forming pixel electrode 13a and terminal electrode 13b spreads through contact holes in silicon nitride films 10 and 6, the liquid can be reliably prevented from reaching aluminum alloy film 4.

As a result, etching and/or corrosion of terminal interconnection 45a and gate electrode 45b including the gate bus-line can be reliably prevented.

Third Embodiment

A liquid crystal display device according to a third embodiment will now be described. The following liquid crystal display device according to the third embodiment employs the nitrogen-containing aluminum film, which is relatively thick, and has a relatively high specific resistance.

Steps similar to those, which are employed in the first embodiment and are described with reference to FIG. 1, are conducted to form aluminum film 4 and nitrogen-containing aluminum film 5 on glass substrate 2.

In the above process, nitrogen-containing aluminum film 5 is formed under the following conditions. The sputtering device has a DC power of 1 KW. A diluted nitrogen gas which is a gas mixture of argon (Al) and 20% of $N_2$ contained in a gas cylinder is used as the nitrogen gas to be supplied into the chamber. The flow rate of this gas mixture is equal to 50 sccm. Thus, net flow rate F of the nitrogen gas is equal to 10 sccm. The film forming time is controlled to increase the thickness of nitrogen-containing aluminum film 5 to about 20 nm. Thereby, the nitrogen-containing aluminum film having a relatively high specific resistance ($1\times10^5$ $\mu\Omega\cdot$cm or less) is formed.

The aluminum alloy film is made of aluminum alloy containing, e.g., 0.2 wt % of copper.

Thereafter, steps similar to those in the first embodiment shown in FIGS. 2 to 4 are conducted, and silicon nitride film 10 covering thin film transistor T is formed by a step similar to that shown in FIG. 5.

Anisotropic etching is effected on silicon nitride films 10 and 6 masked with a predetermined photoresist pattern so that contact holes 11a and 11b are formed.

For forming contact holes 11a and 11b, etching is effected in two steps.

In the first etching, a gas mixture of $CF_4$ and $O_2$ or a gas mixture of $SF_6$ and $O_2$ is used, and overetching at a rate of about 125% is effected. Thereafter, supply of $O_2$ gas is stopped, and $N_2$ gas is supplied.

In the second etching, a gas mixture of $CF_4$ and $N_2$ or a gas mixture of $SF_6$ and $N_2$ is used, and etching is performed for about 50 seconds.

In the above manner, the oxygen gas is stopped, and the nitrogen gas is supplied before the surface of aluminum alloy film 4 is exposed by etching of nitrogen-containing aluminum film 5. Therefore, such a situation is prevented that the subsequently exposed surface of aluminum alloy film 4 is subjected to the oxygen ($O_2$) to form a coating film of aluminum oxide. Thus, the aluminum layer containing the nitrogen is formed on the surface of aluminum alloy film 4.

Then, steps similar to those employed in the first embodiment and shown in FIGS. 7 to 9 are conducted so that the liquid crystal display device is completed.

Figure 12:
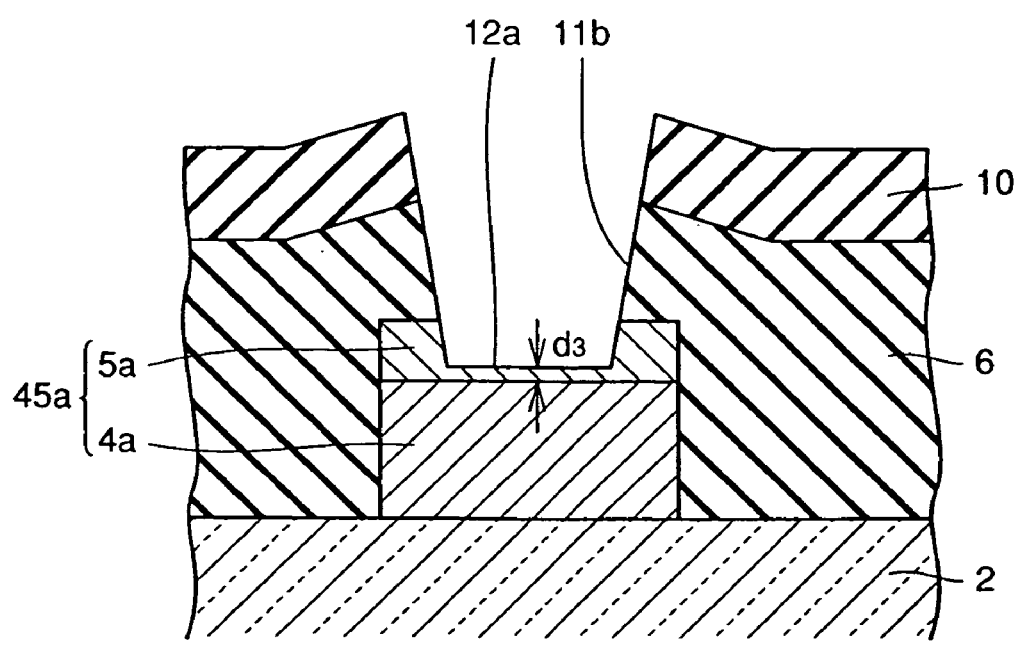
FIG. 12 is a fragmentary cross section showing, on an enlarged scale, a step performed in a method of manufacturing a liquid crystal display device according to a third embodiment of the invention.

According to the manufacturing method, as shown in FIG. 12, the nitrogen-containing aluminum film of a desired thickness can be easily formed in contact portion 12a owing to the etching performed in two steps even in such a case that the uniformity of nitrogen-containing aluminum film 5 on glass substrate 2 is not good, and control of thickness $d_3$ in the contact portion is difficult.

More specifically, even if the surface of aluminum alloy film 4 is partially exposed on the bottom of contact hole 11b during formation of contact hole 11b by the etching, the nitrogen-containing aluminum film having an expected thickness from 2 to 4 nm is formed on the exposed surface because the oxygen gas is stopped, and the nitrogen gas is supplied before the surface of aluminum alloy film 4 is exposed.

As a result, the good contact resistance can be achieved in contact portion 12a, and signal delay can be prevented similarly to the liquid crystal display device of the first embodiment.

In the liquid crystal display device of this embodiment, the nitrogen-containing aluminum film outside contact portion 12a has a thickness larger than that (about 12 nm) of the nitrogen-containing aluminum film in the liquid crystal display device of the first embodiment.

Similarly to the liquid crystal display device of the second embodiment, therefore, etching and/or corrosion of terminal interconnection 45a and gate electrode 45b including the gate bus-line can be reliably prevented.

Fourth Embodiment

A liquid crystal display device according to the fourth embodiment of the invention will now be described. In the liquid crystal display devices of the first to third embodiments, layered structures each including the aluminum alloy film and the nitrogen-containing aluminum film are employed as the terminal interconnections and gate electrodes. In the liquid crystal display device of this embodiment, layered structures each including the aluminum alloy film and the nitrogen-containing aluminum film are employed also as the source electrode and the drain electrode of the thin film transistor, as will be described below.

Figure 13:
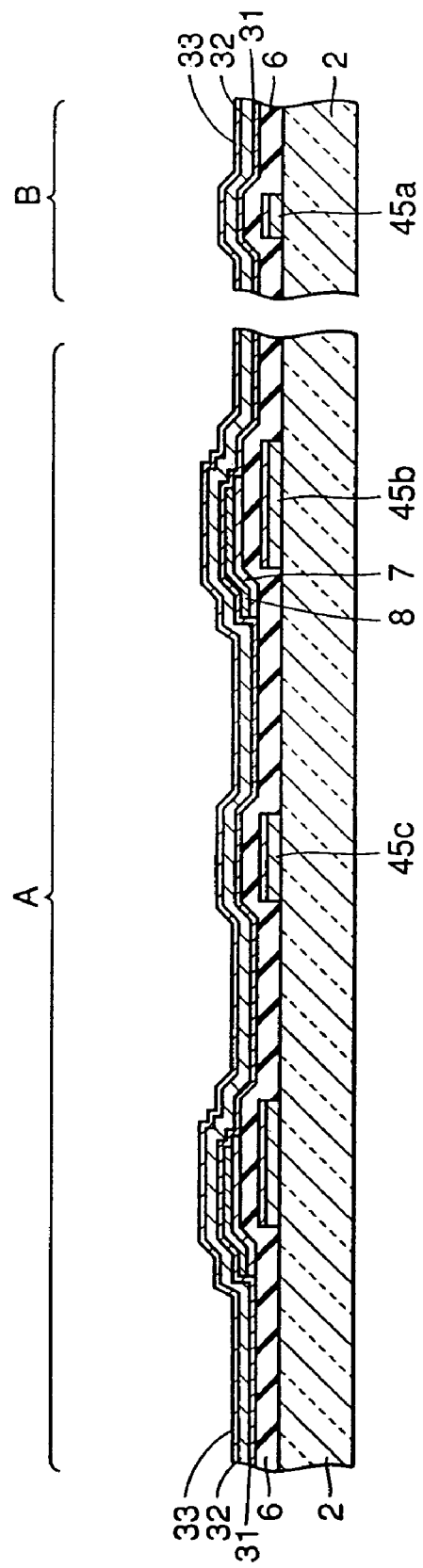
FIG. 13 is a cross section showing a step performed in a method of manufacturing a liquid crystal display device according to a fourth embodiment.

Steps similar to those in the first embodiment shown in FIGS. 1 to 3 are performed, and then a chrome film 31 of about 100 nm in thickness is formed by the sputtering method as shown in FIG. 13. An aluminum alloy film 32 of about 200 nm in thickness is formed by the sputtering method over chrome film 31. Further, a nitrogen-containing aluminum film 33 is formed on aluminum alloy film 32.

In the above process, nitrogen-containing aluminum film 33 is formed under the following conditions. The sputtering device has a DC power of 1 KW. A diluted nitrogen gas which is a gas mixture of argon (Ar) and 10% of $N_2$ contained in a gas cylinder is used as the nitrogen gas to be supplied into the chamber. The flow rate of this gas mixture is equal to 50 sccm. Thus, net flow rate F of the nitrogen gas is equal to 5 sccm. Growth rate of the nitrogen-containing aluminum film is set to about 20 nm/min. The film forming time is controlled to increase the thickness of nitrogen-containing aluminum film 5 to about 30 nm.

Aluminum alloy film 32 is made of aluminum alloy containing, e.g., 0.2 wt % of copper.

Then, a photoresist pattern (not shown) is formed on nitrogen-containing aluminum film 33. Using the photoresist pattern as a mask, etching is effected on nitrogen-containing aluminum film 33 and aluminum alloy film 32, and further etching is effected on chrome film 31.

Figure 14:
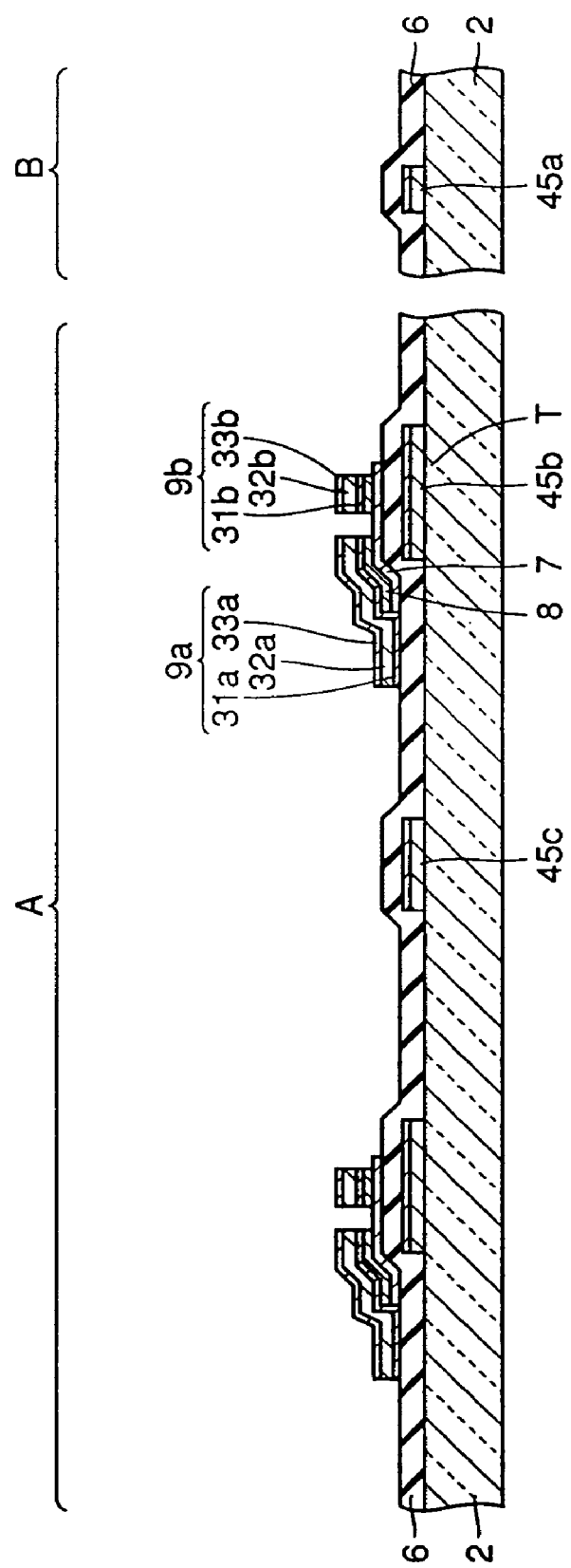
FIG. 14 is a cross section showing a step performed after the step shown in FIG. 13 according to the fourth embodiment.

Then, dry etching is effected to remove n$^+$-type amorphous silicon film 8 on the channel region so that source electrodes 9a including the source interconnection and drain electrodes 9b are formed as shown in FIG. 14. Thereafter, the photoresist pattern is removed.

Figure 15:
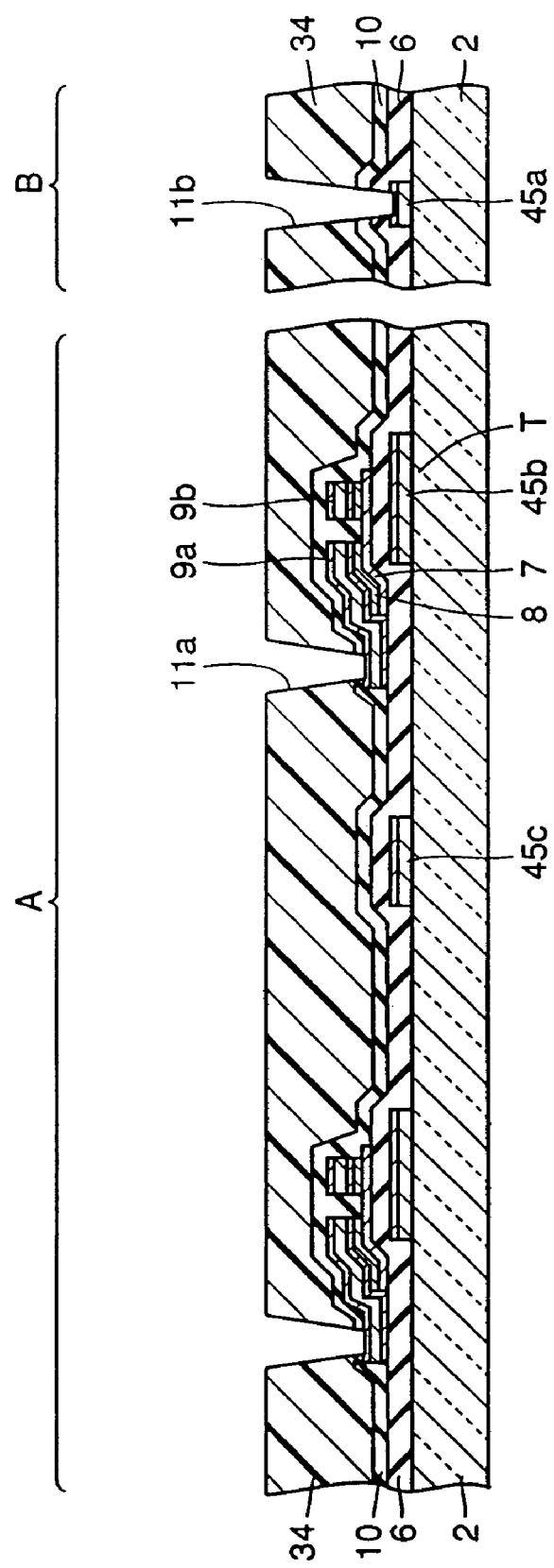
FIG. 15 is a cross section showing a step performed after the step shown in FIG. 14 according to the fourth embodiment.

Referring to FIG. 15, silicon nitride film 10 is formed by the CVD method or the like on silicon nitride film 6 for protecting thin film transistors T. A photosensitive transparent resin film 34, which has a thickness of about 3 μm and is made of, e.g., acrylic resin, is applied onto silicon nitride film 10.

Then, photoengraving is conducted to etch photosensitive transparent resin film 34 and silicon nitride films 10 and 6, whereby contact holes 11a and 11b are formed. An etching gas for this etching is made of $CF_4$ or $SF_6$. The overetching rate is equal to about 30%. The purpose of this is to prevent such a situation that the overetching reduces the thickness of the nitrogen-containing aluminum film in the contact portion to a value below a desired value.

In contact hole 11a through which the surface of source electrode 9a is exposed, nitrogen-containing aluminum film 33a is etched after etching of silicon nitride film 10 in contrast to contact hole 11b. Therefore, the nitrogen-containing aluminum film in contact hole 11a is etched by a thickness larger than that by which nitrogen-containing aluminum film 5a is etched in contact hole 11b.

Figure 16:
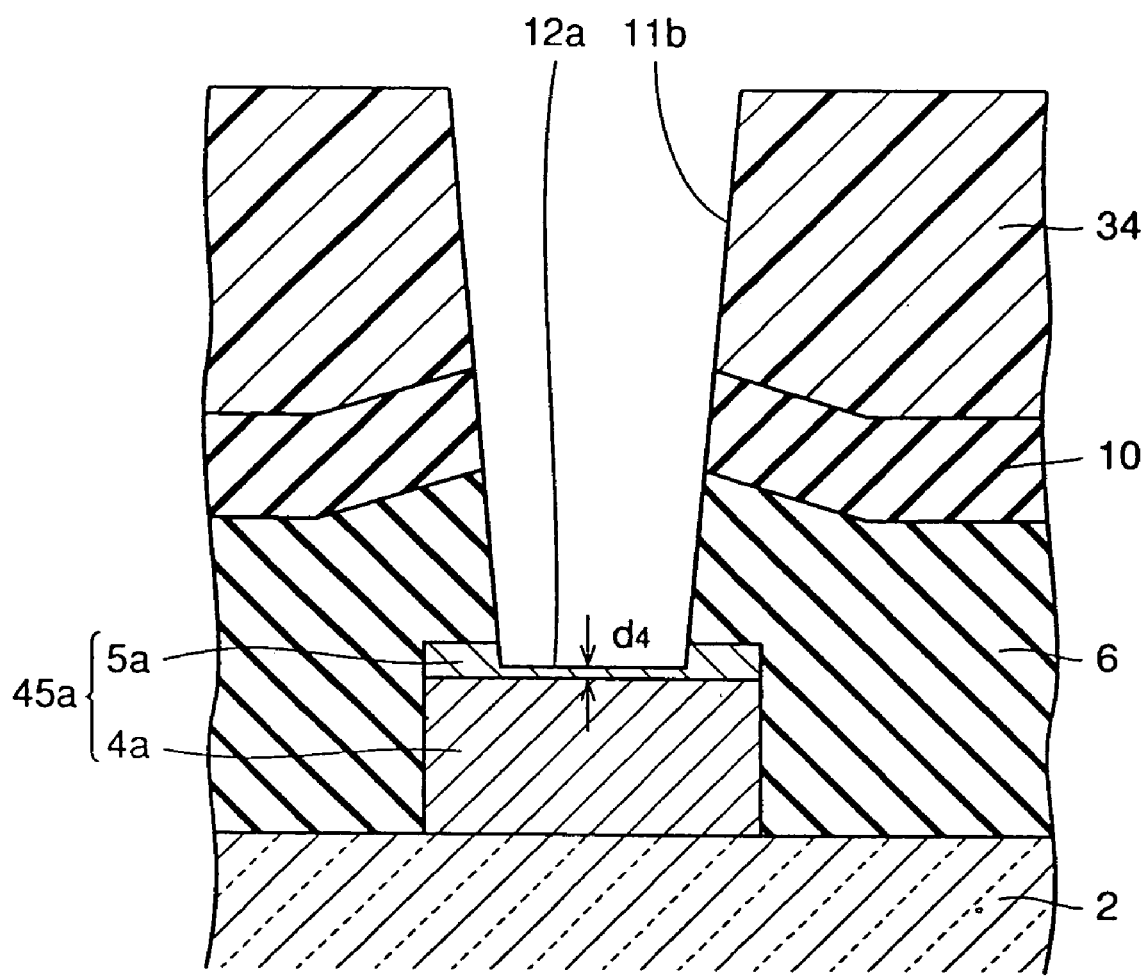
FIG. 16 is a fragmentary cross section showing, on an enlarged scale, the step shown in FIG. 15 according to the fourth embodiment.
Figure 17:
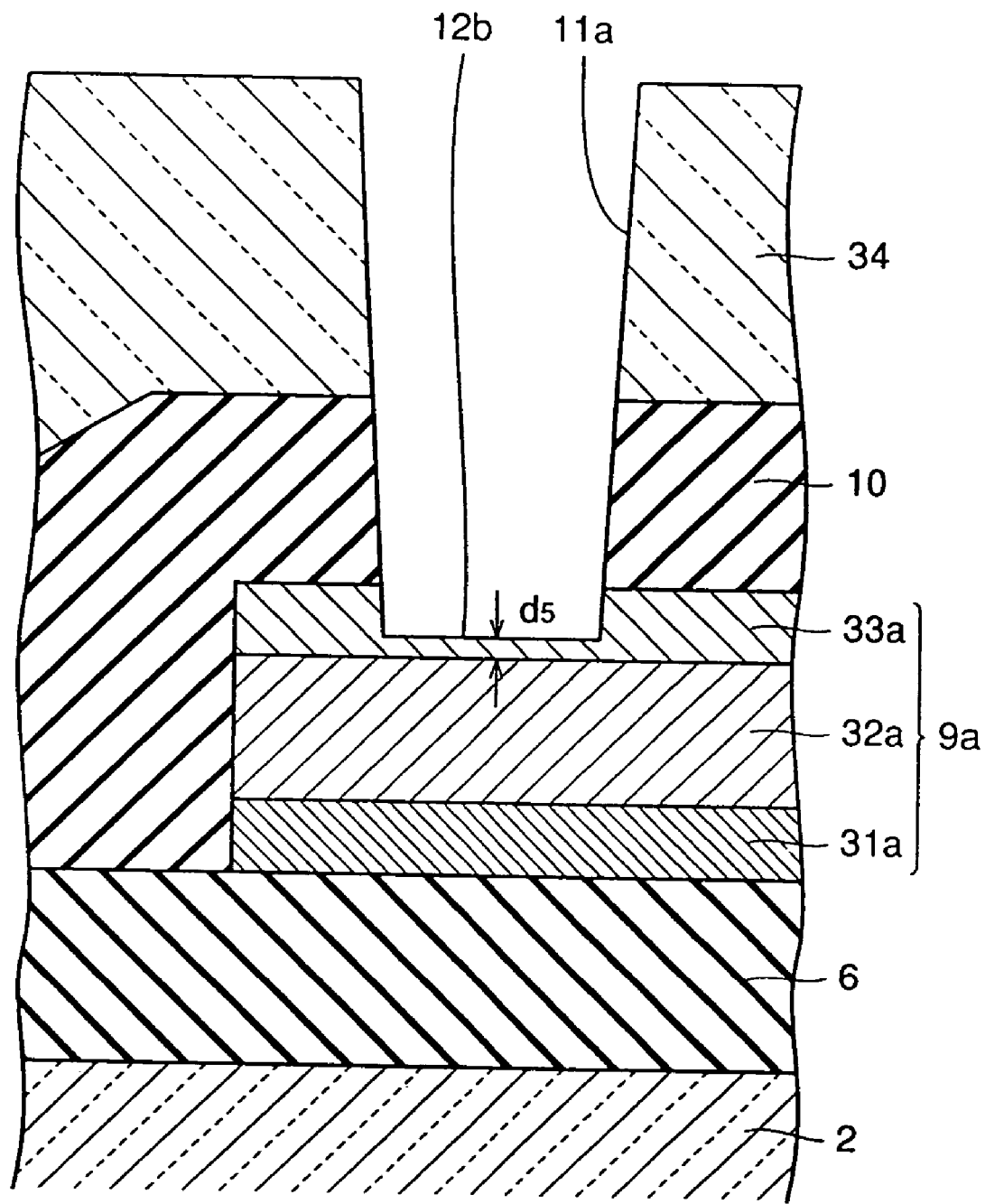
FIG. 17 is another fragmentary cross section showing, on an enlarged scale, the step shown in FIG. 15 according to the fourth embodiment.

In this case, as shown in FIGS. 16 and 17, the thickness of nitrogen-containing aluminum film 33 is determined to be larger by about 30 nm than that of nitrogen-containing aluminum film 5. Thereby, nitrogen-containing aluminum film 33a in the contact portion within contact hole 11a can have a desired thickness. This will be described later in greater detail.

Figure 18:
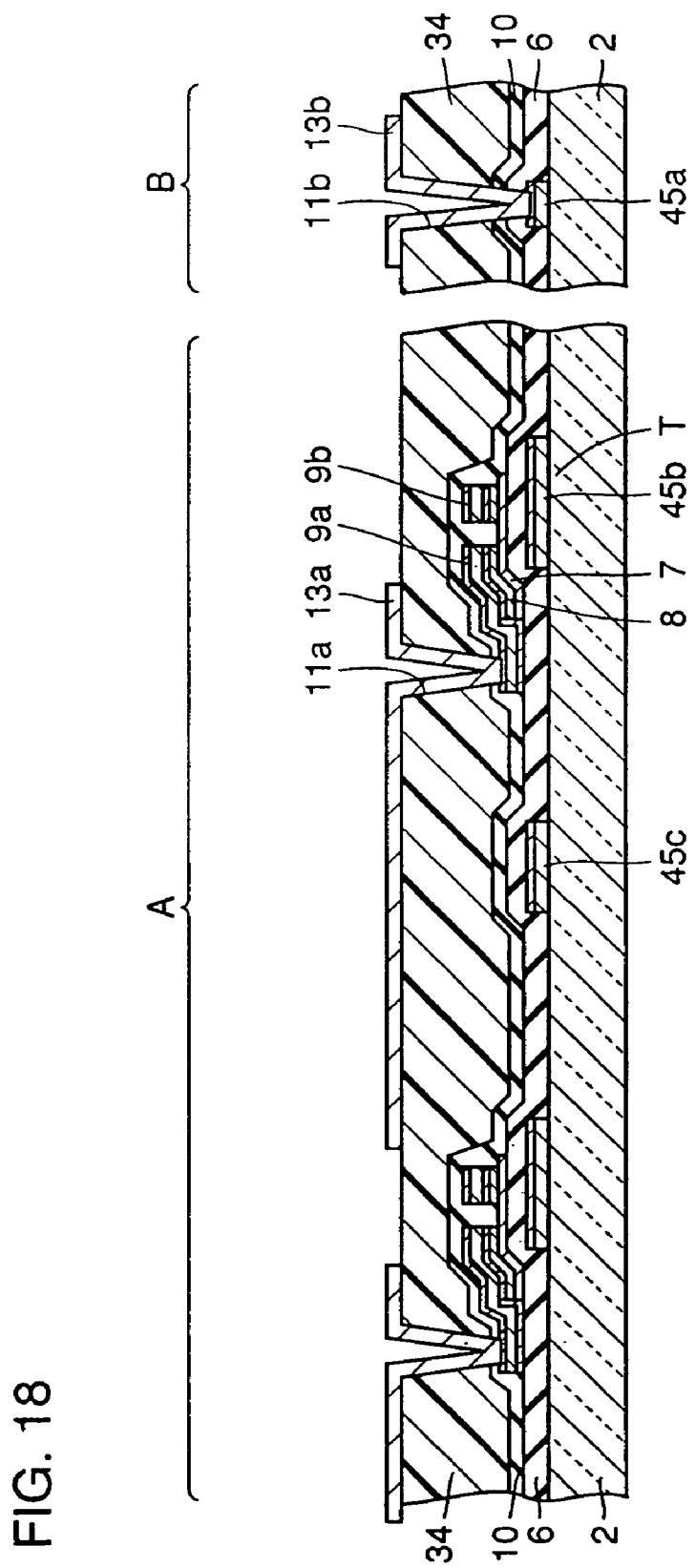
FIG. 18 is a cross section showing a step performed after the step shown in FIG. 15 according to the fourth embodiment.

Referring to FIG. 18, an ITO film (not shown) of about 100 nm in thickness is formed, e.g., by the sputtering method on photosensitive transparent resin film 34 including contact holes 11a and 11b. A predetermined photoresist pattern (not shown) is formed on this ITO film.

Etching is effected on the ITO film thus masked with the photoresist pattern to form pixel electrodes 13a and terminal electrodes 13b. Thereafter, steps similar to those of the first embodiment shown in FIGS. 8 and 9 are performed so that the liquid crystal display device is completed.

The manufacturing method described above provides the nitrogen-containing aluminum film having desired thicknesses in respective contact portions 12a and 12b within contact holes 11a and 11b shown in FIGS. 16 and 17.

In contact hole 11b, the silicon nitride films are etched by a thickness of about 500 nm in total (silicon nitride film 6 is etched by 400 nm, and silicon nitride film 10 is etched by 100 nm). This etching causes overetching of 30%. As a whole, therefore, the etching reduces a thickness of about 650 nm in terms of thickness of the silicon nitride film, and the thickness reduced by the overetching corresponds to about 150 nm.

In contact hole 11a, the silicon nitride film is etched by a thickness of about 100 nm in total (silicon nitride film 10 is etched by 100 nm). This etching reduces a thickness of about 650 nm in terms of thickness of the silicon nitride film, and the thickness reduced by the overetching corresponds to about 550 nm.

Assuming that an etching selection ratio (AlN/SiN) between the nitrogen-containing aluminum film and the silicon nitride film is equal to about ⅟₂₀, nitrogen-containing aluminum film 5a in contact hole 11b is etched by about 7.5 nm. Since the initial thickness of nitrogen-containing aluminum film 5a is about 12 nm, a nitrogen-containing aluminum film $d_4$ of about 4.5 nm in thickness is left when the etching ends.

In contact hole 11a, nitrogen-containing aluminum film 33a is etched by about 27.5 nm. Since the initial thickness of nitrogen-containing aluminum film 33a is about 30 nm, a nitrogen-containing aluminum film $d_5$ of about 2.5 nm in thickness is left when the etching ends.

In this manner, the nitrogen-containing aluminum films can have the thicknesses which provide desired contact resistance values in contact portions 12a and 12b, respectively.

The liquid crystal display device described above employs photosensitive transparent resin film 34 of about 1 μm or more in thickness. If photosensitive transparent resin film 34 is not employed, etching for forming source electrode 19a and drain electrode 9b causes a large eaves 41 of nitrogen-containing aluminum film 33a as shown in FIG. 19 because the nitrogen-containing aluminum film has a relatively large thickness of 20 nm or more.

Figure 19:
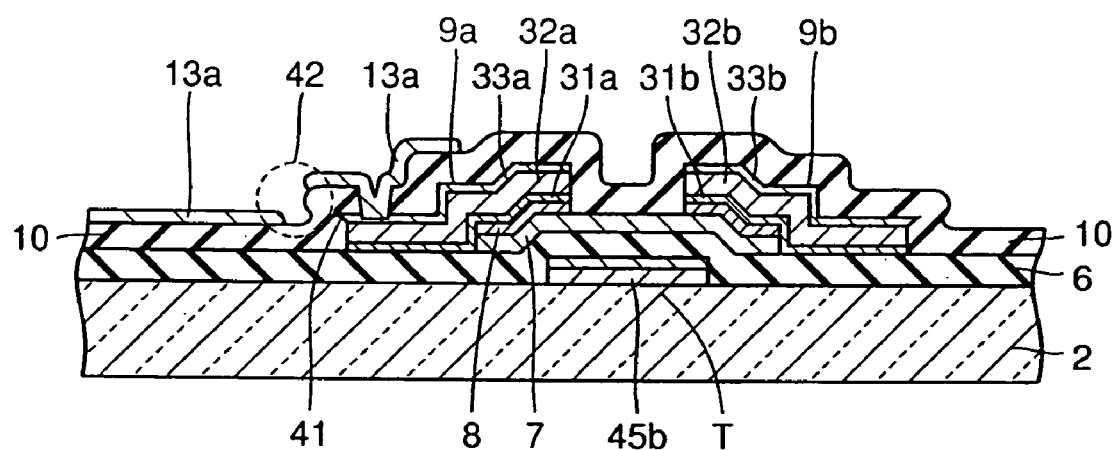
FIG. 19 is a fragmentary cross section showing, on an enlarged scale, an advantage of the liquid crystal display device according to the fourth embodiment.
Figure 20:
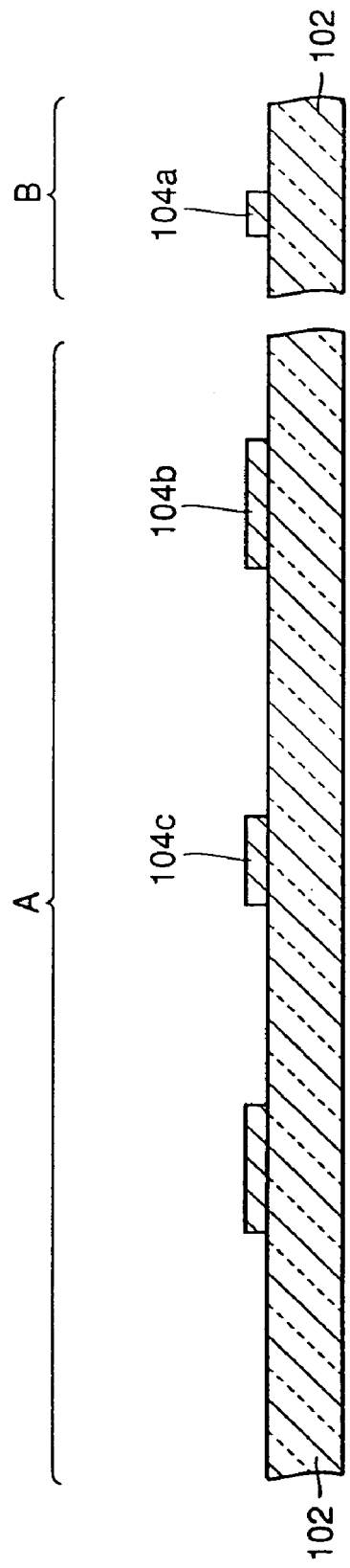
FIG. 20 is a cross section showing a step in a method of manufacturing a liquid crystal display device in the prior art.
Figure 21:
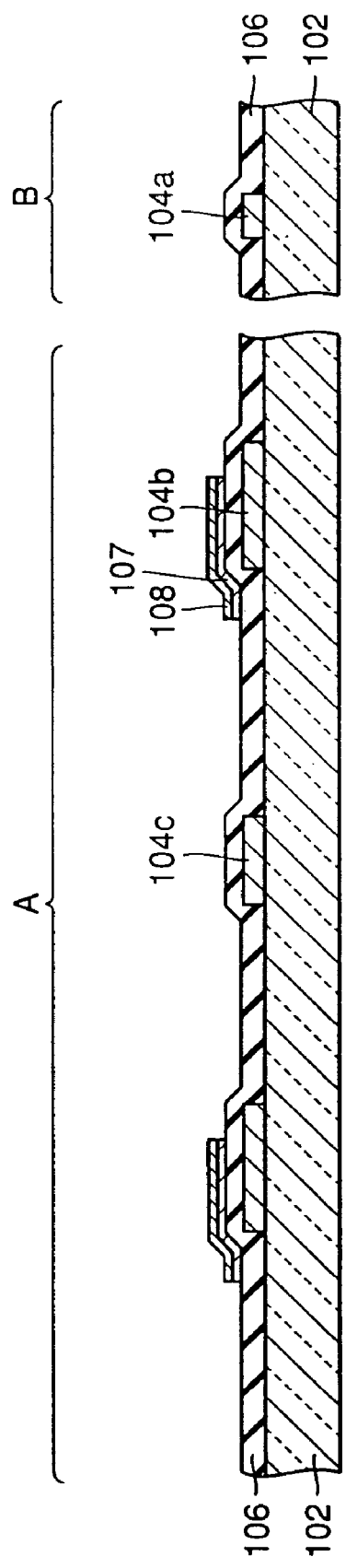
FIG. 21 is a cross section showing a step performed after the step shown in FIG. 20.
Figure 22:
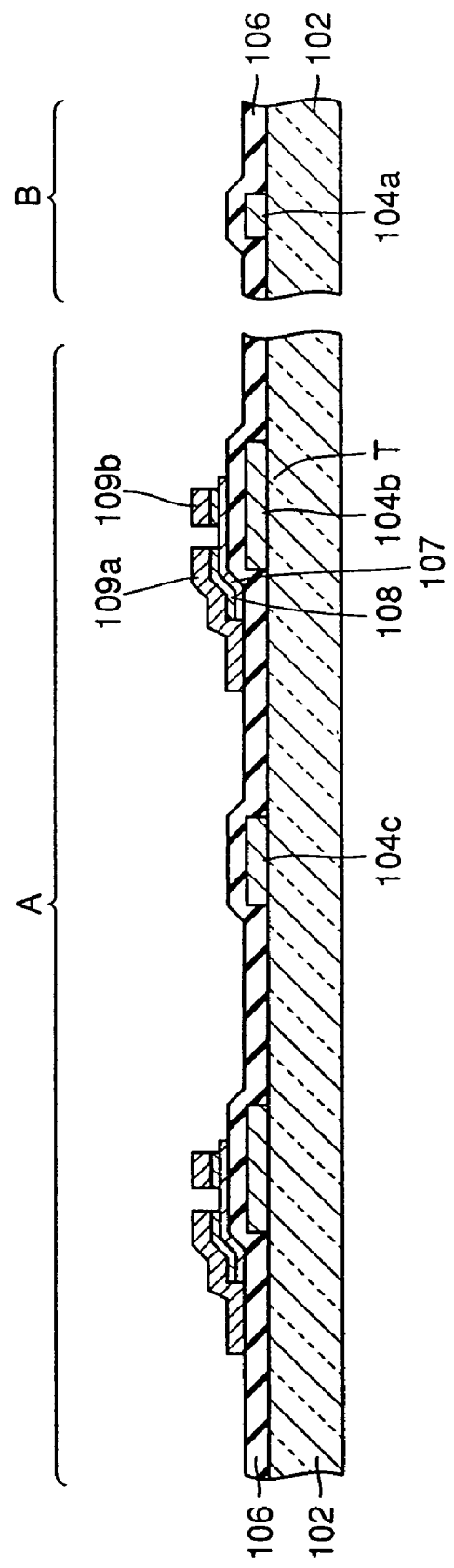
FIG. 22 is a cross section showing a step performed after the step shown in FIG. 21.
Figure 23:
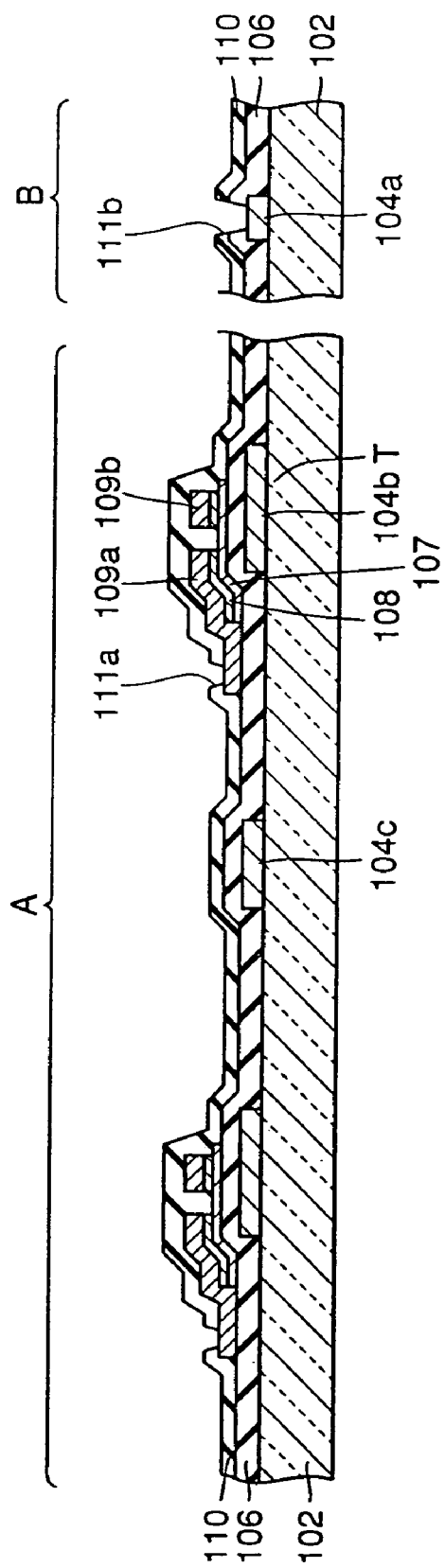
FIG. 23 is a cross section showing a step performed after the step shown in FIG. 22.
Figure 24:
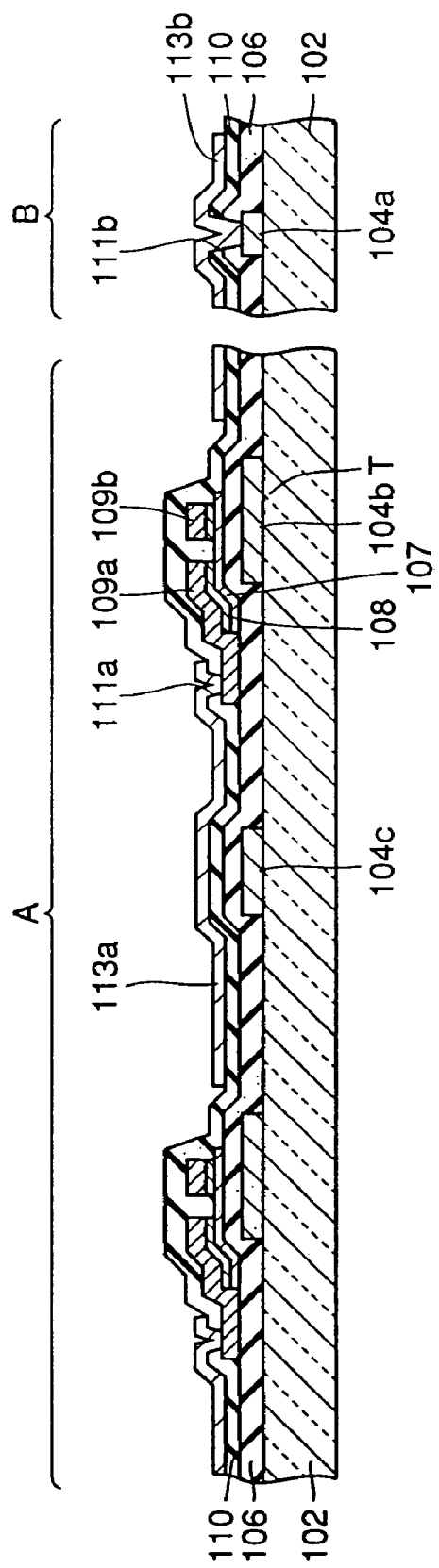
FIG. 24 is a cross section showing a step performed after the step shown in FIG. 23.

Therefore, as depicted within a circle 42 of dotted line in FIG. 19, eaves 41 may cause breakage of pixel electrode 13a, which is made of an ITO film and is formed on the stepped portion of source electrode 9a.

According to the liquid crystal display device, since the photosensitive transparent resin film 34 is formed as described above, it can provide a flat surface on which pixel electrode 13a and others are formed, and breakage of pixel electrode 13a can be prevented.

If the dry etching is employed instead of the wet etching for forming source electrode 9a and drain electrode 9b, formation of the eaves of nitrogen-containing aluminum film 33a can be prevented. In this case, photosensitive transparent resin film 34 can be eliminated.

The dry etching described above can be performed, e.g., under the following conditions. Reactive Ion Etching (RIE) is employed, and chlorine ($Cl_2$) and boron trichloride ($BCl_3$) are used as the etching gas. The pressure in the chamber is set to 10 Pa. The RF power is 1500 W. The etching time is 120 seconds.

Similar etching may be employed for forming the gate electrodes including the gate bus-lines in the liquid crystal display devices of the respective embodiments already described. Thereby, the eaves of the nitrogen-containing aluminum film is not formed even if the nitrogen-containing aluminum film has a thickness of 20 nm or more, and therefore the margin of the initial thickness of the gate bus-line can be increased. Further, a resistance of the interconnections against chemical liquid can be improved by increasing the thickness of the nitrogen-containing aluminum film.

By employing the photosensitive transparent resin film, a parasitic capacitance between pixel electrode 13a and drain electrode 9a can be reduced, and such a structure can be employed that pixel electrode 13a overlaps with drain electrode 9a including the drain interconnection.

Thereby, the source interconnection covers widthwise an insufficiently oriented region around pixel electrode 13a, and a numerical aperture of the liquid crystal display device panel can be improved. The numerical aperture is a ratio between a region where a black matrix 19 shown in FIG. 8 and interconnections intercept the light and a region through which light can pass.

By using aluminum alloy having a relatively low resistance, each interconnection width can be reduced in design, and thereby the numerical aperture can be further increased.

Each of the foregoing embodiments has been described in connection with the liquid crystal display device using the amorphous silicon thin film transistors of the channel etching type. However, the aluminum alloy film and the nitrogen-containing aluminum film can be applied to the source interconnections of the liquid crystal display device using low-temperature polycrystalline silicon thin film transistors of a planar type. Thereby, similar effects can be achieved.

In addition to the liquid crystal display devices, various kinds of semiconductor devices having multi-layer interconnection structures containing aluminum alloy may employ the contact portions, in which the nitrogen-containing aluminum films have predetermined thicknesses, respectively, whereby semiconductor devices having low contact resistances can be achieved.

The contact portions located in the contact holes have been described by way of example. In addition to this, the foregoing structure can be applied to a portion where two interconnections are in electrical contact so that the contact resistance can be significantly reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A liquid crystal display device comprising:
   a transparent substrate having a main surface;
   a first conductive layer formed on the main surface of said substrate;
   an insulating film formed on said substrate and covering said first conductive layer;
   a contact hole formed in said insulating film, and exposing the surface of said first conductive layer; and
   a transparent second conductive layer formed on said insulating film, filling said contact hole, and electrically connected to said first conductive layer;
   said first conductive layer having
   a lower layer portion primarily made of aluminum, and
   an upper layer portion layered on said lower layer portion and including aluminum containing nitrogen;
   said contact hole exposing the surface of said upper layer portion; and
   said upper layer portion in the contact portion within said contact hole having a thickness determined to provide a predetermined contact resistance based on a specific resistance value of said upper layer portion.

2. The liquid crystal display device according to claim 1, wherein
   said upper layer portion in said contact portion has the thickness d satisfying a relationship of:

$$0 < \rho \cdot d < 3 \ \Omega \cdot \mu m^2$$

in the case where the specific resistance $\rho$ of said upper layer portion satisfies a relationship of $$50 < \rho \leq 1 \times 10^5 \ \mu\Omega \cdot cm, \text{ and}$$

satisfying a relationship of:

$$0 < d < 3 \ nm$$

in the case where said specific resistance $\rho$ satisfies a relationship of $1 \times 10^5 \ \mu\Omega \cdot cm < \rho$; and
   said predetermined contact resistance R satisfies a relationship of:

$$R \cdot S < 100 \ M\Omega \cdot \mu m^2$$

where S represents an area of said contact portion.

* * * * *